(12) United States Patent
Hwang et al.

(10) Patent No.: US 10,553,449 B2
(45) Date of Patent: Feb. 4, 2020

(54) METHODS OF FORMING A SILICON LAYER, METHODS OF FORMING PATTERNS, AND METHODS OF MANUFACTURING SEMICONDUCTOR DEVICES USING THE SAME

(71) Applicant: SAMSUNG ELECTRONICS CO., LTD., Suwon-si, Gyeonggi-do (KR)

(72) Inventors: Sun-Hye Hwang, Hwaseong-si (KR); Youn-Joung Cho, Jwasepmg-si (KR); Won-Woong Chung, Suwon-si (KR); Nam-Gun Kim, Yongin-si (KR); Kong-Soo Lee, Hwaseong-si (KR); Badro Im, Yongin-si (KR); Yoon-Chul Cho, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 148 days.

(21) Appl. No.: 15/700,491

(22) Filed: Sep. 11, 2017

(65) Prior Publication Data

US 2018/0102260 A1 Apr. 12, 2018

(30) Foreign Application Priority Data

Oct. 12, 2016 (KR) .......................... 10-2016-0131908

(51) Int. Cl.
*H01L 21/3213* (2006.01)
*H01L 21/311* (2006.01)

(52) U.S. Cl.
CPC .. *H01L 21/32139* (2013.01); *H01L 21/31144* (2013.01)

(58) Field of Classification Search
CPC .................................................. H01L 21/3213
See application file for complete search history.

(56) References Cited

U.S. PATENT DOCUMENTS

| 7,998,536 | B2 | 8/2011 | Yim et al. |
| 8,088,687 | B2 | 1/2012 | Yeom et al. |
| 8,580,100 | B2 | 11/2013 | Feng et al. |
| 9,111,897 | B2 | 8/2015 | Jee et al. |
| 2004/0147651 | A1 | 7/2004 | Barruel et al. |
| 2009/0117742 | A1 | 5/2009 | Jung |
| 2014/0273512 | A1 | 9/2014 | Kim et al. |

FOREIGN PATENT DOCUMENTS

| KR | 10-2005-0094690 A | 9/2005 |
| KR | 10-2008-0111944 A | 12/2008 |
| KR | 10-2010-00079959 A | 7/2010 |
| KR | 10-1149811 B1 | 7/2012 |

*Primary Examiner* — Marvin Payen
(74) *Attorney, Agent, or Firm* — Lee & Morse, P.C.

(57) ABSTRACT

A method of forming a pattern includes forming an etch target layer on a substrate, forming sacrificial patterns on the etch target layer, the sacrificial patterns including a carbon-containing material, providing a silicon-sulfur compound or a sulfur-containing gas onto the sacrificial patterns to form a seed layer, providing a silicon precursor onto the seed layer to form silicon-containing mask patterns, and at least partially etching the etch target layer using the mask patterns.

10 Claims, 27 Drawing Sheets

METHODS OF FORMING A SILICON LAYER, METHODS OF FORMING PATTERNS, AND METHODS OF MANUFACTURING SEMICONDUCTOR DEVICES USING THE SAME

CROSS-REFERENCE TO RELATED APPLICATION

Korean Patent Application No. 10-2016-0131908, filed on Oct. 12, 2016, in the Korean Intellectual Property Office and entitled: "Methods Of Forming A Silicon Layer, Methods Of Forming Patterns And Methods Of Manufacturing Semiconductor Devices Using the Same," is incorporated by reference herein in its entirety.

BACKGROUND

1. Field

Example embodiments relate to methods of forming a silicon layer, methods of forming patterns, and methods of manufacturing semiconductor devices using the same.

2. Description of the Related Art

A carbon-containing layer, e.g., amorphous carbon layer (ACL), spin-on hardmask (SOH), etc., may be used for forming fine patterns, e.g., gate electrodes, wirings, contacts, insulation patterns, etc., in a semiconductor device. An additional mask layer may be formed on the carbon-containing layer in order to enhance the etching selectivity thereof.

SUMMARY

According to example embodiments, a method of forming a pattern includes forming an etch target layer on a substrate, forming sacrificial patterns on the etch target layer, the sacrificial patterns including a carbon-containing material, providing a silicon-sulfur compound or a sulfur-containing gas onto the sacrificial patterns to form a seed layer, providing a silicon precursor onto the seed layer to form silicon-containing mask patterns, and at least partially etching the etch target layer using the mask patterns.

According to example embodiments, there is provided a method of forming a pattern. In the method, an etch target layer may be formed on a substrate. First masks may be formed on the etch target layer. A sulfur-containing compound may be provided onto the first masks to form a seed layer. A silicon precursor may be provided onto the seed layer to form sacrificial spacers on sidewalls of the first masks, respectively. Second masks may be formed between the sacrificial spacers. The sacrificial spacers may be removed. The etch target layer may be partially etched using the first and second masks.

According to example embodiments, there is provided a method of forming a pattern. In the method, an etch target layer may be formed on a substrate. A first mask layer may be formed on the etch target layer. A gas including sulfur-containing compound may be provided onto the first mask layer to form a seed layer. A second mask layer may be provided on the seed layer. The second mask layer may be patterned to form a second mask pattern.

According to example embodiments, a method of manufacturing a semiconductor device includes forming an isolation layer on a substrate to define active patterns, forming first sacrificial patterns on the active patterns and the isolation layer, the first sacrificial patterns including a carbon-containing material, providing a silicon-sulfur compound or a sulfur-containing gas onto the first sacrificial patterns to form a seed layer, providing a silicon precursor onto the seed layer to form silicon-containing first mask patterns on sidewalls of the first sacrificial patterns, respectively, partially etching the active patterns and the isolation layer using the first mask patterns to form gate trenches, and forming gate structures in the gate trenches, respectively According to example embodiments, a method of forming a silicon layer includes providing a silicon-sulfur compound or a sulfur-containing gas onto a carbon-containing material layer to form a seed layer, and providing a silicon precursor onto the seed layer to form the silicon layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
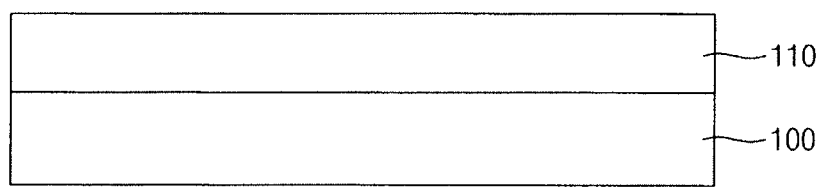
FIGS. 1, 2, 3A and 3B illustrate cross-sectional views of a method of forming a silicon layer in accordance with an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Like reference numerals refer to like elements throughout.

FIGS. 1, 2, 3A and 3B are cross-sectional views illustrating a method of forming a silicon layer in accordance with an example embodiment.

Referring to FIG. 1, a lower layer 110 may be formed on a substrate 100.

The substrate 100 may include, e.g., silicon, germanium, silicon-germanium or a III-V compound such as GaP, GaAs, GaSb, etc. In some embodiments, the substrate 100 may be a silicon-on-insulator (SOI) substrate or a germanium-on-insulator (GOI) substrate. P-type or n-type impurities may be implanted into an upper portion of the substrate 100 to form a well. Circuit patterns, e.g., gate structures, impurity regions, wirings, contact plugs, etc., may be formed on the substrate 100.

In the present example embodiment, the lower layer 110 may include a carbon-containing material. For example, the lower layer 110 may include carbon and oxygen, and an atomic ratio of carbon to oxygen may be greater than 1. For example, the lower layer 110 may include amorphous carbon layer (ACL) or an organic material, e.g., a carbon-containing spin-on hardmask (SOH or C—SOH).

In the present example embodiment, the lower layer 110 may also include an inorganic material, e.g., silicon oxide, silicon nitride and/or silicon oxynitride. In the present example embodiment, the lower layer 110 may also include a conductive material, e.g., a metal, a metal nitride, a metal silicide, etc., or a semiconductor material, e.g., polysilicon.

Silicon-Sulfur Compound

Figure 2:
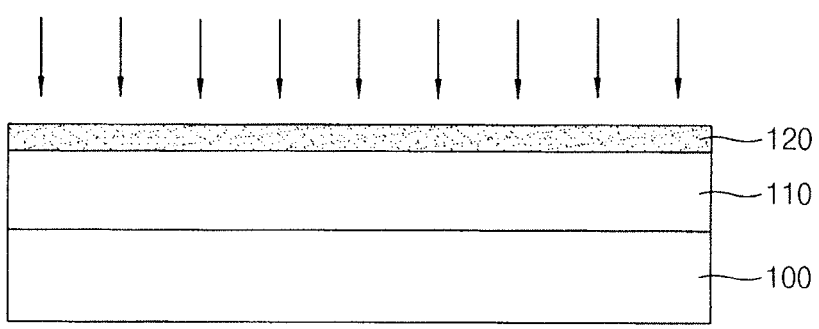

Referring to FIG. 2, a sulfur-containing compound, e.g., a silicon-sulfur compound or a sulfur-containing gas, may be provided onto the lower layer 110 to form a seed layer 120. In the present example embodiment, the sulfur-containing compound may be provided in a gaseous state.

The sulfur-containing compound may include, e.g., a silicon-sulfur compound, and in this case, the seed layer 120 may include a silicon seed layer. The silicon-sulfur compound may serve as a silicon-sulfur precursor for forming the silicon seed layer.

In the present example embodiment, the silicon-sulfur compound may include at least one of compounds represented by following Chemical Formulae 1 to 4.

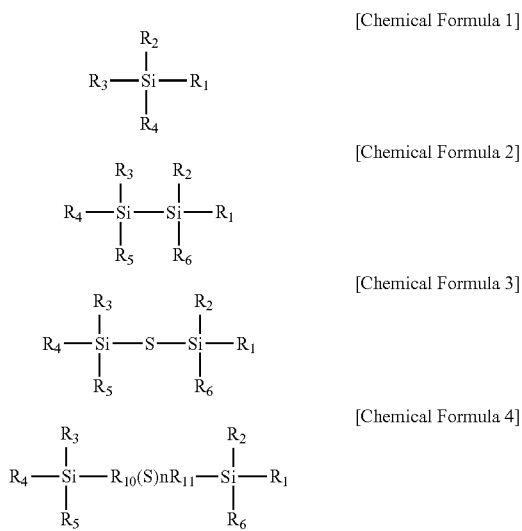

In Chemical Formulae 1 to 4, $R_1$, $R_2$, $R_3$, $R_4$, $R_5$, and $R_6$ may be independently selected from $R_7$, $R_8$, —$SR_7$, —$NR_7R_8$, —$OR_7$, —$SiR_7$, and —$R_9SR_8$. $R_7$ and $R_8$ may be independently selected from hydrogen, halogen (F, Cl, Br, or I), $C_1$-$C_{10}$ alkyl, $C_3$-$C_{10}$ alkenyl, $C_3$-$C_{10}$ alkynyl, $C_6$-$C_{10}$ aryl, $C_3$-$C_{10}$ heteroaryl, $C_3$-$C_{10}$ cycloalkyl, $C_3$-$C_{10}$ cycloalkenyl, $C_3$-$C_{10}$ cycloalkynyl, $C_3$-$C_{10}$ heterocycloalkyl, or a combination thereof. $R_9$ may be a divalent group of $C_1$-$C_{10}$ alkyl, $C_3$-$C_{10}$ alkenyl, $C_3$-$C_{10}$ alkynyl, $C_6$-$C_{10}$ aryl, $C_3$-$C_{10}$ heteroaryl, $C_3$-$C_{10}$ cycloalkyl, $C_3$-$C_{10}$ cycloalkenyl, $C_3$-$C_{10}$ cycloalkynyl, $C_3$-$C_{10}$ heterocycloalkyl, or a combination thereof. Terms "alkyl, alkenyl, alkynyl" may include a linear structure and a molecular structure.

In Chemical Formula 1, at least one of $R_1$, $R_2$, $R_3$, and $R_4$ may be —$SR_7$ including sulfur. Chemical Formula 1 may be, e.g., bis(tert-butylthio)silane.

In Chemical Formula 2, at least one of $R_1$, $R_2$, $R_3$, $R_4$, $R_5$, and $R_6$ may be —$SR_7$.

In Chemical Formula 4, $R_{10}$ and $R_{11}$ may be independently a single bond or a divalent group of $C_1$-$C_{10}$ alkyl, $C_3$-$C_{10}$ alkenyl, $C_3$-$C_{10}$ alkynyl, $C_6$-$C_{10}$ aryl, $C_3$-$C_{10}$ heteroaryl, $C_3$-$C_{10}$ cycloalkyl, $C_3$-$C_{10}$ cycloalkenyl, $C_3$-$C_{10}$ cycloalkynyl, $C_3$-$C_{10}$ heterocycloalkyl, or a combination thereof, and n may be an integer equal to or more than 1. For example, n may be an integer from 1 to 5.

In the present example embodiment, the silicon-sulfur compound may include sulfur atoms equal to or more than 2. Thus, a reaction between a surface of the lower layer 110 and a silicon precursor subsequently provided may be enhanced. For example, the silicon-sulfur compound may include bis(tert-butylthio)silane (BTBS), bis(propylthio)silane, bis(tert-butylsulfur)dichlorosilane, etc. These may be used alone or in a combination thereof.

For example, the silicon-sulfur compound may be pyrolyzed to form an active silicon intermediate material including silicon atoms having electrophilicity. The active silicon intermediate material may be adsorbed onto the surface of the lower layer 110 including various organic/inorganic materials to form the seed layer 120.

Sulfur-Containing Gas

In the present example embodiment, the sulfur-containing compound may include a sulfur-containing gas, e.g., hydrogen sulfide ($H_2S$). In this case, a surface of the lower layer 110 may be surface treated by the sulfur-containing compound to form a sulfur-containing portion at an upper portion of the lower layer 110. The sulfur-containing portion of the lower layer 110 may serve as the seed layer for forming a silicon layer.

Silicon Precursor

Figure 3A:
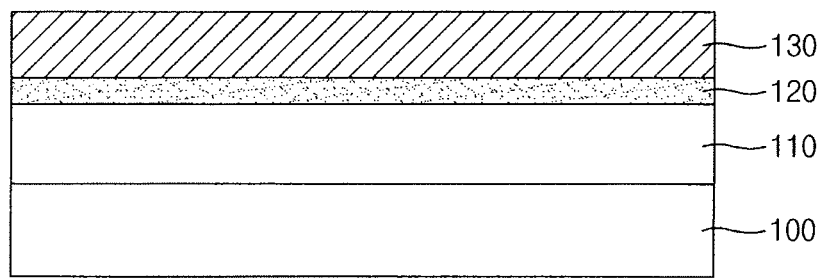
Figure 3B:
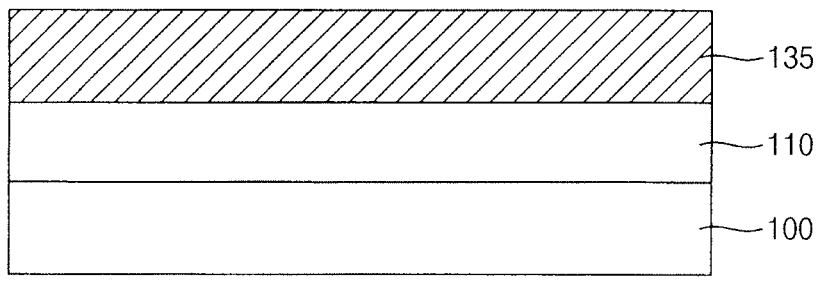

Referring to FIGS. 3A and 3B, a silicon precursor may be provided onto the seed layer 120 to form silicon layers 130 and 135. For example, the silicon precursor may include a silane-based material, e.g., monosilane, disilane, dichlorosilane, etc. In the present example embodiment, as shown in FIG. 3B, the silicon layer 135 may be merged with the seed layer 120.

In the present example embodiment, silicon-sulfide (S—C) bonds may be generated between sulfur atoms at an exposed upper surface of the seed layer 120 and silicon atoms of the silicon precursor. Thus, the silicon layers 130 and 135 may be formed to have enhanced adhesion and stability to the seed layer 120. Additionally, the silicon layers 130 and 135 may have lower surface roughness, and uniform thickness and profile.

Hereinafter, without being bound by theory, the formation process of the seed layer 120 and the silicon layer 130 will be explained by a the following chemical mechanisms.

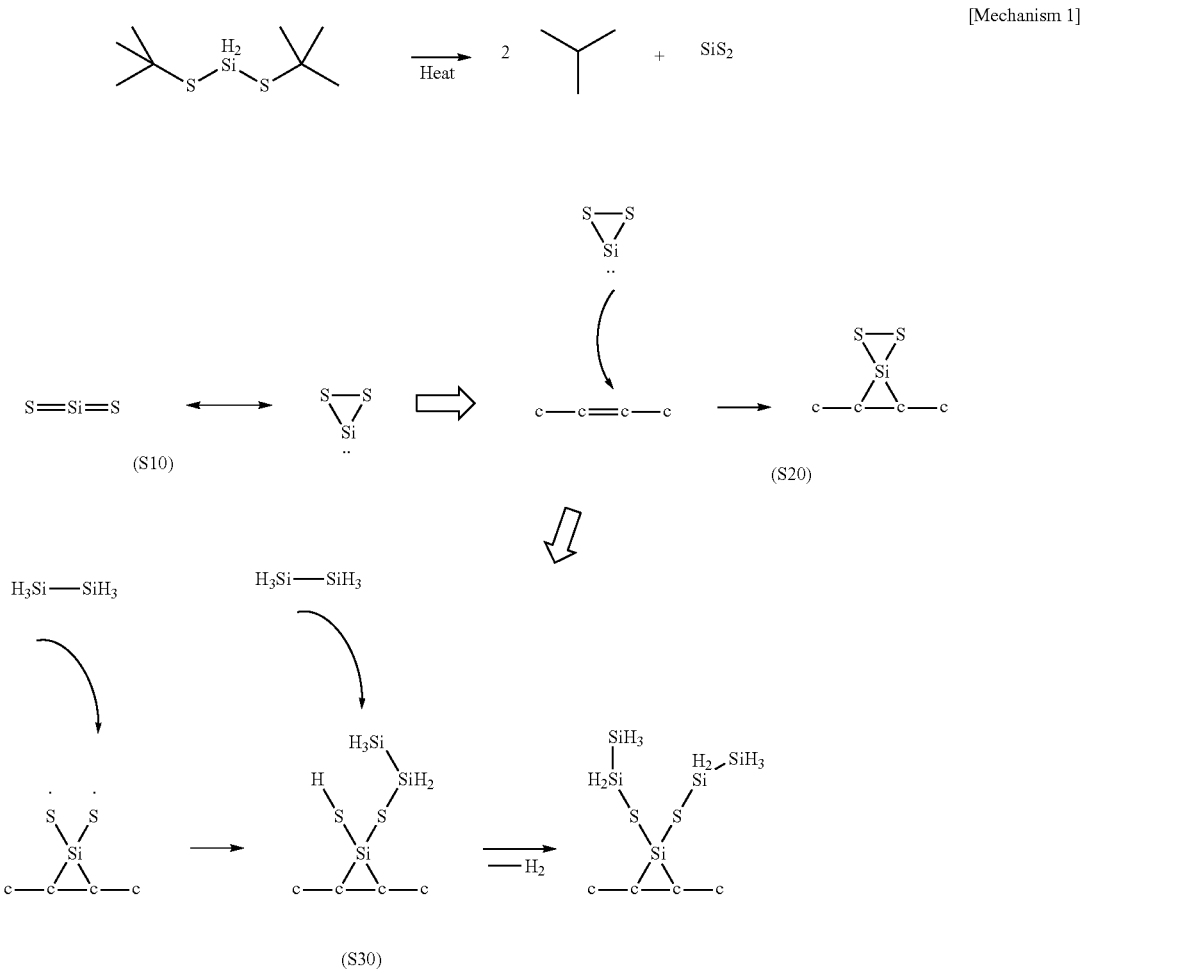

Referring to Mechanism 1, in step S10, the silicon-sulfur compound, e.g., BTBS, may be pyrolyzed in a deposition chamber to remove a tert-butyl group, and an active silicon intermediate material having a $SiS_2$ structure may be generated. The active silicon intermediate material may exist in a linear type (including silicon-sulfur double bond) or a cyclic type, and the electrophilicity of the silicon atom may be enhanced.

In step S20, the active silicon intermediate material may be coupled to a surface of the lower layer 110 including carbon bonds, e.g., carbon pi bonds or carbonyl bonds, to form the seed layer 120. Sulfur atoms may be exposed at an upper surface of the seed layer 120. When the seed layer 120 is formed, carbon-sulfide (C—S) bonds or carbon-silicon (C—Si) bonds may be generated between the lower layer 110 and the silicon-sulfur compound, so that the formation of the seed layer 120 may be enhanced.

In step S30, a silicon precursor, e.g., disilane, may be provided onto the seed layer 120, and S—HC bonds and/or Si—S bonds may be generated to form the silicon layers 130 and 135 including, e.g., polysilicon.

As illustrated in step S20, sulfur atoms in the seed layer 120 may exist in the chemically unstable cyclic type, and thus may have high reactivity. Accordingly, as shown in step S30, the sulfur atoms may be converted into radicals to be easily reacted with the silicon precursor.

Referring to Mechanism 2, carbon atoms and/or hydrogen atoms having partial positive charges may be exposed at an upper surface of the lower layer 110. When a sulfur-containing gas, e.g., hydrogen sulfide is provided, partial negative charges may be generated in a sulfur atom having a relatively large amount of electrons, so as to be interacted with the carbon atoms and/or the hydrogen atoms exposed at the upper surface of the lower layer 110, and thus S—C bond and/or S—H bond may be formed. Accordingly, as illustrated above, the sulfur-containing portion may be formed at the upper portion of the lower layer 110.

When a silicon precursor for a subsequent deposition process, e.g., monosilane ($SiH_4$) is provided, a silicon sulfide bond (indicated by a dotted line) may be formed between a sulfur atom and a silicon atom so that the formation of the silicon layers 130 and 135 may be promoted.

In the present example embodiment, during the formation of the silicon layers 130 and 135, a dopant compound, e.g., borane, phosphine, etc., may be provided together with the silicon precursor. In this case, the silicon layers 130 and 135 may include doped polysilicon, and thus may have conductivity.

In the present example embodiment, during the formation of the silicon layers 130 and 135, a reaction gas including oxygen and/or nitrogen may be provided together with the silicon precursor. In this case, the silicon layers 130 and 135 may include, e.g., silicon oxide, silicon nitride and/or silicon oxynitride. The reaction gas may include, e.g., $O_2$, $O_3$, $H_2O$, $N_2$, $N_2O$, $NO_2$, or $NH_3$, etc. These may be used alone or in a combination thereof.

The seed layer 120 and the silicon layers 130 and 135 may be formed by, e.g., a chemical vapor deposition (CVD) process or an atomic layer deposition (ALD) process. In the present example embodiment, the seed layer 120 and the silicon layers 130 and 135 may be formed in-situ.

The silicon layers 130 and 135 may serve as, e.g., a polysilicon layer, a gate layer, an insulation layer, etc., in a semiconductor device. In the present example embodiment, the silicon layers 130 and 135 may serve as a mask layer including polysilicon.

As illustrated above, the seed layer 120 may be formed on the carbon-containing organic layer, the inorganic insulation layer including oxide or nitride, or the inorganic layer including metal via the active silicon intermediate material using the sulfur-containing compound to have high adhesion or affinity. Additionally, the silicon layers 130 and 135 may have enhanced mechanical or chemical characteristics by the sulfur atoms included in the seed layer 120.

FIGS. 4 to 8 are cross-sectional views illustrating stages of a method of forming a pattern in accordance with an example embodiment. This method may include processes substantially the same as or similar to those illustrated with reference to FIGS. 1, 2, 3A and 3B, and detailed descriptions thereon are omitted herein.

Figure 4:
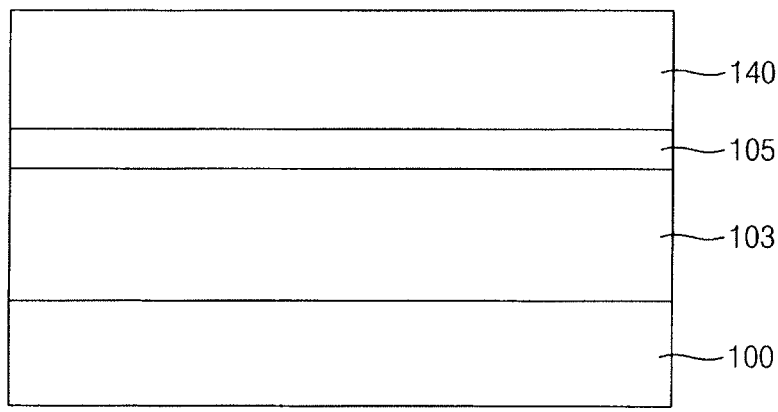
FIGS. 4 to 8 illustrate cross-sectional views of stages of a method of forming a pattern in accordance with an example embodiment.

Referring to FIG. 4, an etch target layer 103, a buffer layer 105 and a first mask layer 140 may be sequentially formed on the substrate 100.

The etch target layer 103 may be converted into fine patterns by the method of forming the pattern in accordance with an example embodiment. The etch target layer 103 may be formed on the substrate 100, and may cover circuit structures on the substrate 100. In this case, the etch target layer 103 may be an insulating interlayer including, e.g., silicon oxide. In the present example embodiment, the etch target layer 103 may be, e.g., a conductive layer including, e.g., a metal, a metal nitride, a metal silicide, a metal silicide nitride, etc.

The buffer layer 105 may be formed on the etch target layer 103, and may reduce or prevent damage or over-etch of the etch target layer 103. For example, the buffer layer 105 may serve as an etch stop layer. The buffer layer 105 may include. e.g., silicon oxynitride or silicon nitride.

The first mask layer 140 may serve as a preliminary mask layer for patterning the etch target layer 103. In the present example embodiment, the first mask layer 140 may include a carbon-containing material. In the present example embodiment, the first mask layer 140 may include ACL. In the present example embodiment, the first mask layer 140 may include C—SOH. In the present example embodiment, the first mask layer 140 may include an inorganic material, e.g., silicon oxide.

Figure 5:
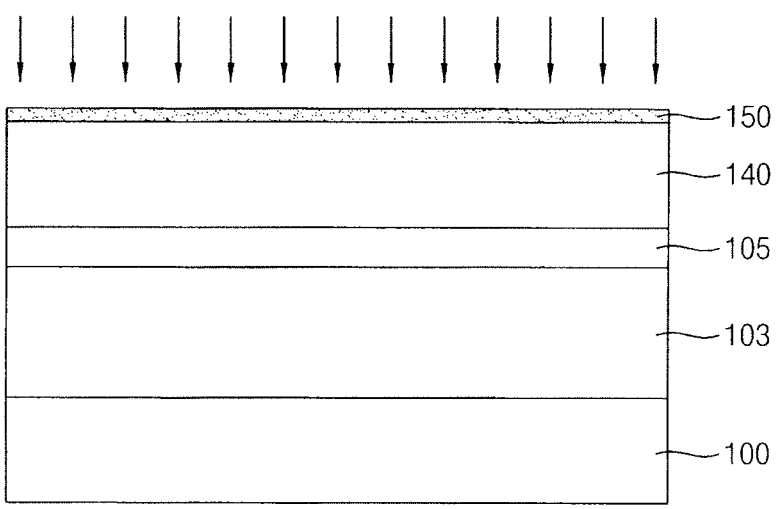

Referring to FIG. 5, processes substantially the same as or similar to those illustrated with reference to FIG. 2 may be performed to form a seed layer 150. As illustrated above, a sulfur-containing compound, e.g., a silicon-sulfur compound or hydrogen sulfide may be provided onto the first mask layer 140 to form the seed layer 150.

Figure 6:
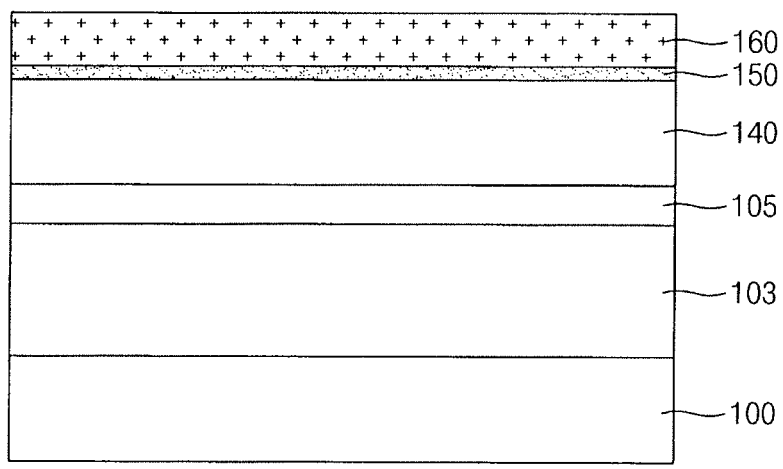

Referring to FIG. 6, processes substantially the same as or similar to those illustrated with reference to FIGS. 3A and 3B may be performed to form a second mask layer 160 on the seed layer 150. In the present example embodiment, the second mask layer 160 may be formed by providing a silicon precursor, e.g., a silane-based compound onto the seed layer 150. The second mask layer 160 may include, e.g., polysilicon, and thus may serve as a silicon layer.

As illustrated above, sulfur atoms exposed at a surface of the seed layer 150 and the silicon precursor may be interacted with each other to form silicon-sulfide bond, and thus the second mask layer 160 having enhanced mechanical characteristics may be formed. In the present example embodiment, as shown in FIG. 3B, the second mask layer 160 may be merged with the seed layer 150.

In the present example embodiment, the second mask layer 160 may include an inorganic material, e.g., photoresist material or silicon oxide. The second mask layer 160 may have enhanced structural stability and reliability due to the surface adhesion or hydrophilicity enhanced by the seed layer 150.

Figure 7:
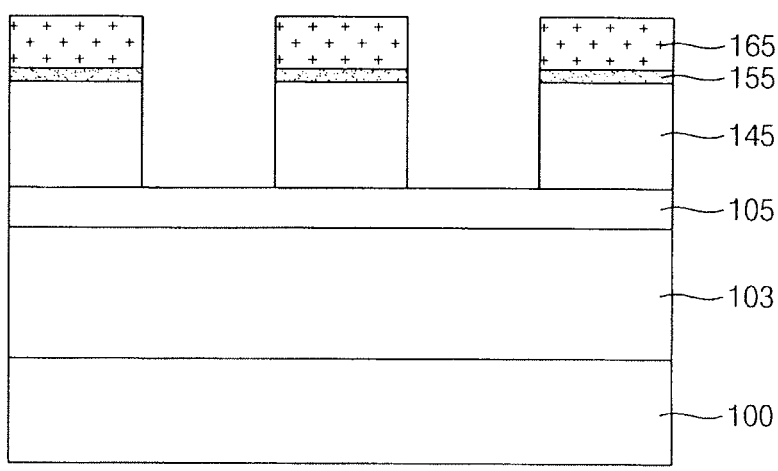

Referring to FIG. 7, the second mask layer 160 may be partially removed to form a second mask 165. The seed layer 150 and the first mask layer 140 may be partially removed using the second mask 165 to form a seed pattern 155 and a first mask 145, respectively.

When the second mask layer 160 is a silicon layer, the second mask 165 may be formed by a dry etching process or a wet etching process. When the second mask layer 160 includes photoresist material, the second mask 165 may be formed by an exposure process and a developing process.

Figure 8:
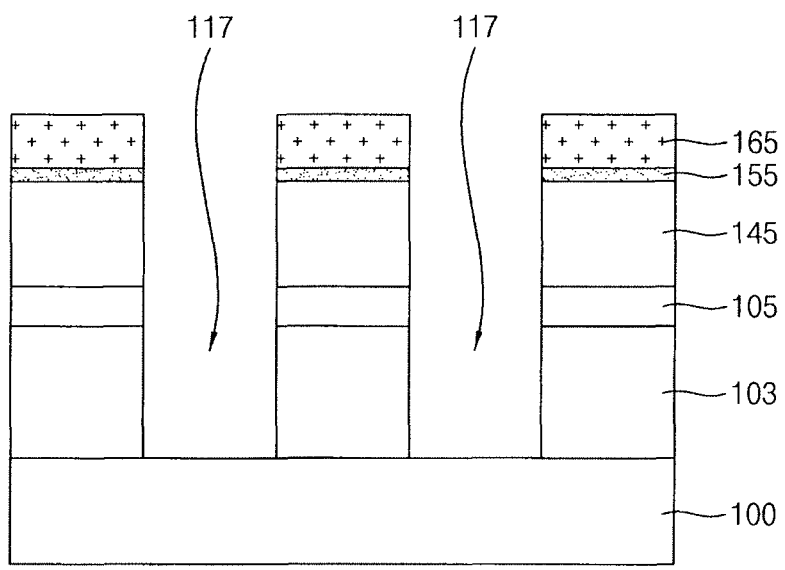

Referring to FIG. 8, the buffer layer 105 and the etch target layer 103 may be patterned using the first and second masks 165 and 145 as an etching mask. Thus, an opening 117 may be formed in the etch target layer 103. The opening 117 may have a hole shape or a linear shape extending in a direction. In the present example embodiment, as the first and second masks 165 and 145 together may serve as the etching mask, and the reliability of the patterning process for the etch target layer 103 may be enhanced.

The first and second masks 165 and 145 may be removed by, e.g., an ashing process and/or a stripping process. In the present example embodiment, when the second mask 165 is a silicon layer, the second mask 165 may be removed by a gas phase etching (GPE) process using, e.g., chlorine gas.

In the present example embodiment, conductive structures, e.g., contacts, plugs, wirings, etc., may be formed in the opening 117. The conductive structures may be formed by forming a conductive layer to fill the opening 117, and planarizing the conductive layer by a chemical mechanical polishing (CMP) process and/or an etch back process. The remaining buffer layer 105 may be also removed in the planarization process.

FIGS. 9 to 16 are cross-sectional views illustrating a method of forming a pattern in accordance with an example embodiment. For example, FIGS. 9 to 16 show a self-aligned double patterning (SADP) process for forming various structures of a semiconductor device. This method may include processes substantially the same as or similar to those illustrated with reference to FIGS. 1, 2, 3A and 3B, and detailed descriptions thereon are omitted herein.

Figure 9:
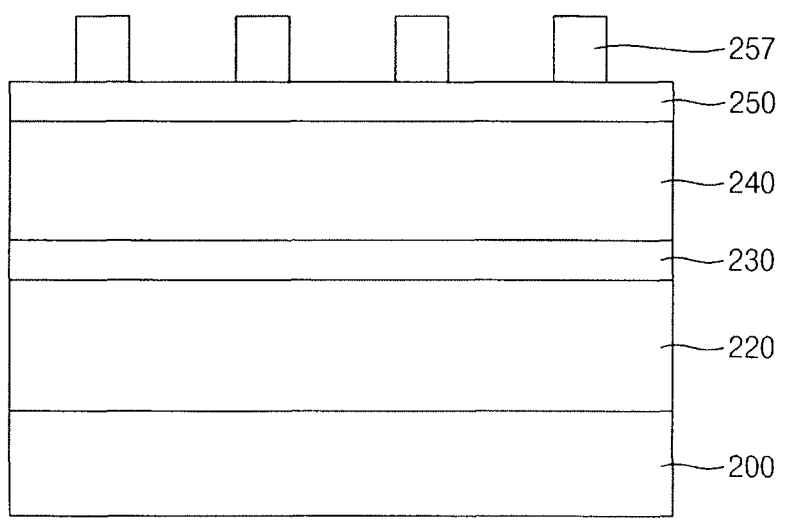
FIGS. 9 to 16 illustrate cross-sectional views of a method of forming a pattern in accordance with an example embodiment.

Referring to FIG. 9, an etch target layer 220, a first buffer layer 230, a preliminary mask layer 240, a second buffer layer 250 and a photoresist pattern 257 may be sequentially formed on a substrate 200.

The first and second buffer layers 230 and 250 may serve as an etch stop layer. For example, the first and second buffer layers 230 and 250 may be formed of silicon nitride or silicon oxynitride. In the present example embodiment, at least one of the first and second buffer layers 230 and 250 may be omitted.

The preliminary mask layer 240 may serve as a sacrificial layer for the SADP process. In the present example embodiment, the preliminary mask layer 240 may be formed of a carbon-containing material, e.g., amorphous carbon or SOH.

For example, the etch target layer 220 and the first and second buffer layers 230 and 250 may be formed by a deposition process, e.g., a CVD process, an ALD process, a sputtering process. The preliminary mask layer 240 may be formed by a deposition process using a carbon precursor or a spin coating process. A photoresist layer may be formed on the preliminary mask layer 240 or the second buffer layer 250, and the photoresist layer may be partially removed by an exposure process and a developing process to form a photoresist pattern 257.

Figure 10:
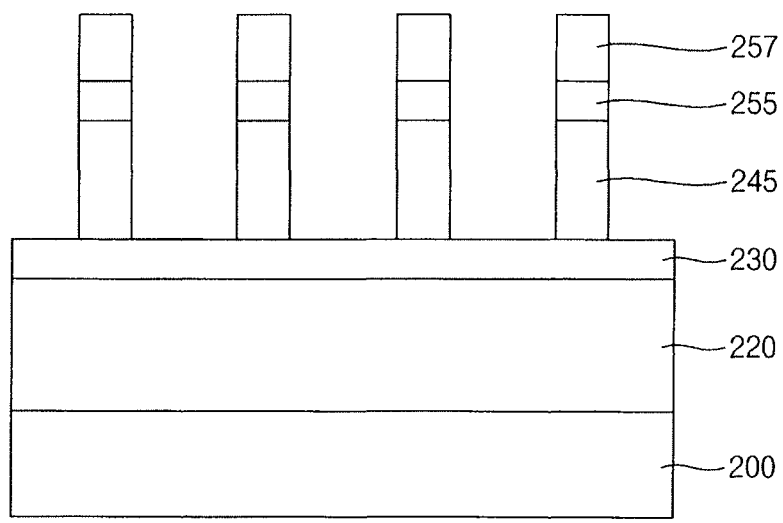

Referring to FIG. 10, the second buffer layer 250 and the preliminary mask layer 240 may be partially etched by a dry etching process using the photoresist pattern 257 as an etching mask. Thus, a stacked structure of a preliminary mask 245 and a second buffer pattern 255 may be formed on the second buffer layer 230. The photoresist pattern 257 may be removed by an ashing process and/or a stripping process. The preliminary mask 245 may serve as a sacrificial pattern that may be removed subsequently.

Figure 11A:
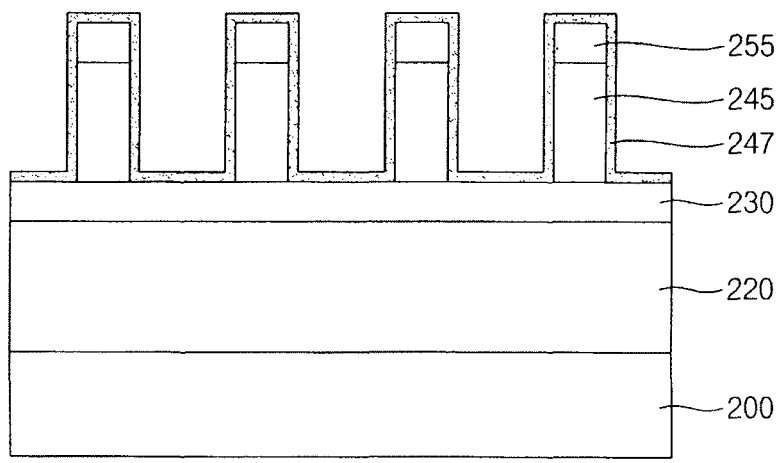
Figure 11B:
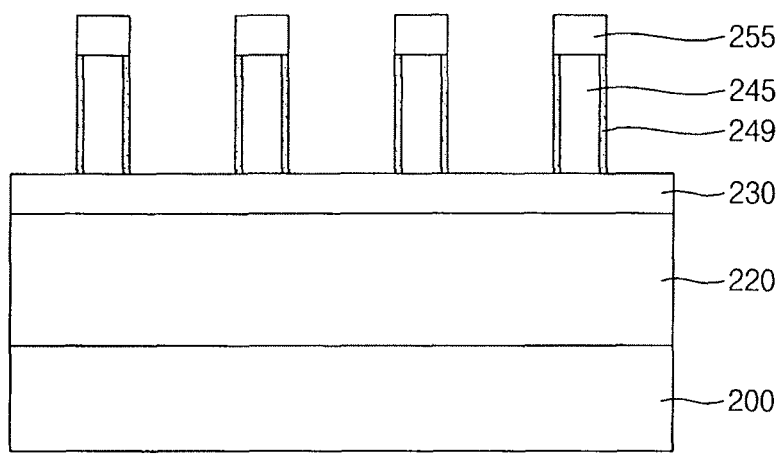

Referring to FIGS. 11A and 11B, as shown in FIG. 2, a sulfur-containing compound may be provided onto the stacked structure to form seed layers 247 and 249. For example, a surface of the preliminary mask 245 including a carbon-containing material and the sulfur-containing compound may be interacted with each other to form the seed layers 247 and 249.

In the present example embodiment, as shown in FIG. 11A, the seed layer 247 may be conformally formed on the first buffer layer 230, the preliminary mask 245, and the second buffer pattern 255. In the present example embodiment, as shown in FIG. 11B, the seed layer 247 may be formed by sulfurating a sidewall of the preliminary mask 245. For example, as illustrated with reference to Mechanism 2, when hydrogen sulfide is provided, the sidewall of the preliminary mask 245 may be surface treated to form a sulfur-containing portion, and the sulfur-containing portion may serve as the seed layer 249.

Figure 12:
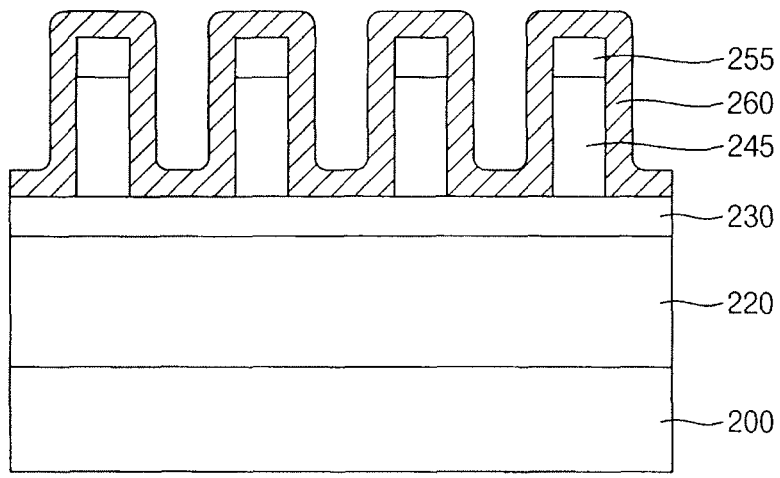

Referring to FIG. 12, a mask layer 260 may be formed on an upper surface of the first buffer layer 230 and a surface of the stacked structure. In the present example embodiment, the mask layer 260 may be formed of silicon, e.g., polysilicon or amorphous silicon. For example, the mask layer 260 may be formed by a process substantially the same as or similar to the process for forming the silicon layers 130 and 135 illustrated with reference to FIGS. 3A and 3B.

The preliminary mask 245 including a carbon-containing material may have hydrophobicity, and may lack a functional group for interacting the mask layer 260. Thus, when the mask layer 260 is formed directly on the preliminary mask 245, the reliability of a thickness and profile of a layer, and a mechanical failure, e.g., void or seam may be formed in the mask layer 260.

However, in the present example embodiment, the seed layers 247 and 249 may be formed using the sulfur-containing compound, and a silicon precursor may be provided by a CVD process or an ALD process. The adhesion and/or affinity between the preliminary mask 245 and the mask layer 260 may be enhanced by the interaction (e.g., silicon-sulfide bond) between the sulfur atoms exposed at a surface of the seed layers 247 and 249 and the silicon precursor. In the present example embodiment, the mask layer 260 may be merged with the seed layers 247 and 249.

Figure 13:
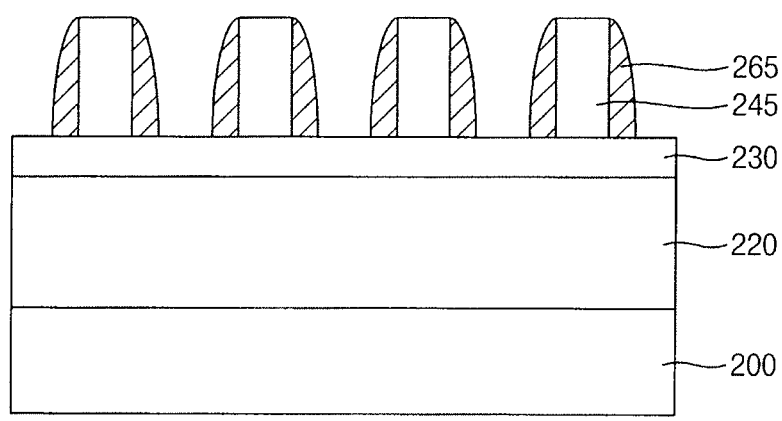

Referring to FIG. 13, the mask layer 260 may be partially removed by an etch back process and/or an anisotropic etching process to form a mask pattern 265.

In the present example embodiment, the mask layer 260 may be divided into a plurality of mask patterns 265 each of which may be formed on a sidewall of the preliminary mask 245. The mask pattern 265 may be self-aligned with the sidewall of the preliminary mask 245. The mask pattern 265 may be formed on each of opposite sidewalls of the preliminary mask 245, and two mask patterns 265 may face each other between neighboring ones of the preliminary mask 245.

In an example embodiment, the second buffer pattern 255 may be removed together with an upper portion of the mask layer 260 by the CMP process. In an example embodiment, the second buffer pattern 255 may remain, and the mask pattern 265 may extend to a sidewall of the second buffer pattern 255.

Figure 14:
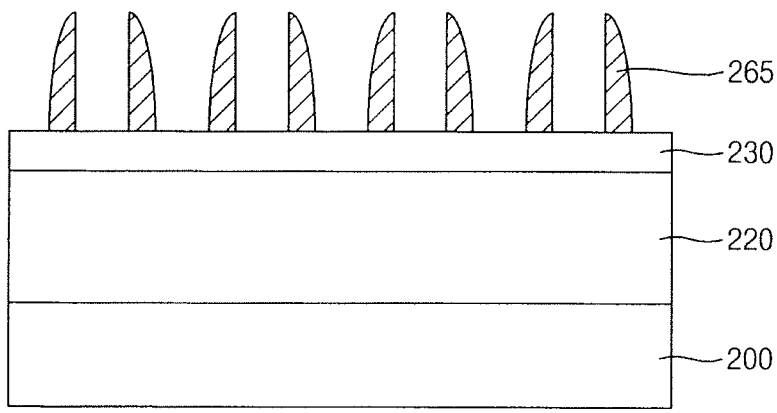

Referring to FIG. 14, the preliminary masks 245 may be removed. Thus, mask patterns 265 may remain on the first buffer layer 230. For example, the preliminary masks 245 may be removed by an ashing process.

A cleaning process may be further performed to remove the sulfur-containing portion or the seed layers 247 and 249. Sulfur atoms included in the sulfur residue is a group VI element having partial negative charges, and thus may be easily removed by a hydrophilic cleaning solution.

Figure 15:
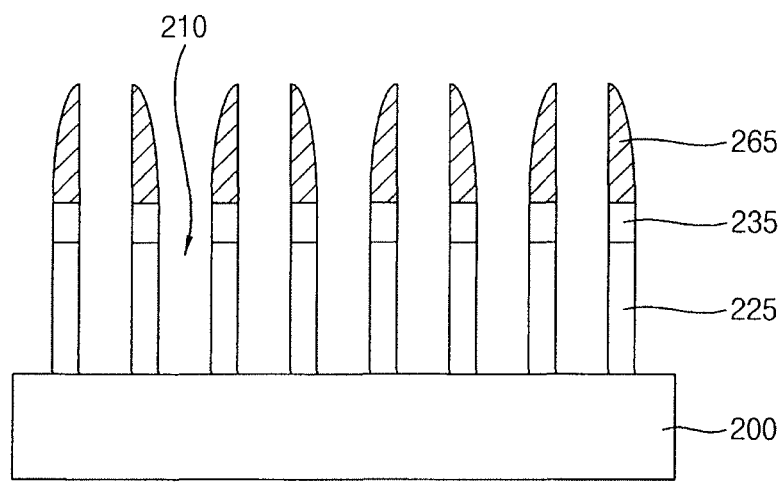

Referring to FIG. 15, the first buffer layer 230 and the etch target layer 220 may be partially etched using the mask pattern 265. Thus, a first buffer pattern 235 and a target pattern 225 may be formed from the first buffer layer 230 and the etch target layer 220, respectively, under the mask pattern 265. The target pattern 225 may include openings 210 that may be defined by spaces generated from the removed portions, respectively, of the etch target layer 220.

Figure 16:
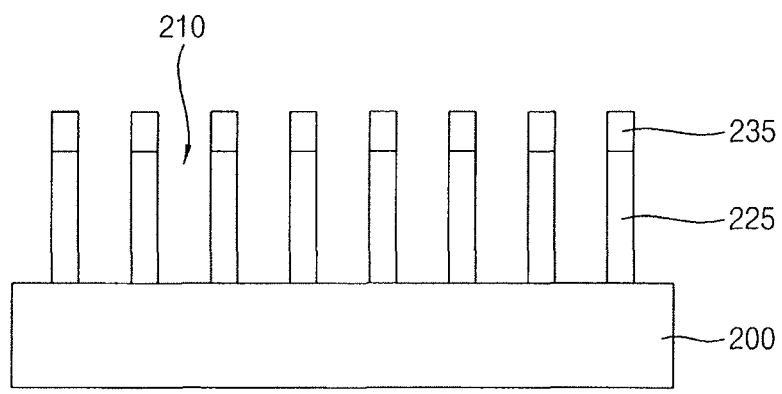

Referring to FIG. 16, the mask pattern 265 may be removed. For example, the mask pattern 265 may be removed by a GPE process using chlorine gas.

In an example embodiment, conductive structures, e.g., contacts, plugs, wirings, etc., may be formed in the opening 210. The conductive structures may be formed by forming a conductive layer to sufficiently fill the opening 210, and planarizing the conductive layer. The first buffer pattern 235 may be also removed by the planarization process.

FIGS. 17 to 21 are cross-sectional views illustrating stages of a method of forming a pattern in accordance with an example embodiment. For example, FIGS. 17 to 21 show a double patterning method, e.g., a self-aligned reverse patterning (SARP) method. This method may include processes substantially the same as or similar to those illustrated with reference to FIGS. 9 to 16, and detailed descriptions thereon are omitted herein.

Figure 17:
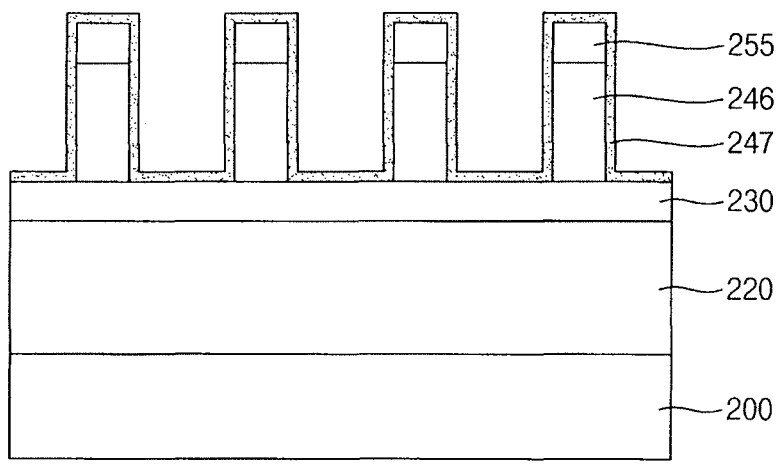
FIGS. 17 to 21 illustrate cross-sectional views of stages of a method of forming a pattern in accordance with an example embodiment.

Referring to FIG. 17, processes substantially the same as or similar to those illustrated with reference to FIGS. 9 to 11A may be performed. In the present example embodiment, a stacked structure including a first mask 246 and the second buffer pattern 255 sequentially stacked may be formed on the first buffer layer 230. The seed layer 247 may be formed on the first buffer layer 230 and the stacked structure.

In the present example embodiment, the first mask 246 may be formed by a process substantially the same as or similar to the process for forming the preliminary mask 245 illustrated with reference to FIG. 10. For example, the first mask 246 may include a carbon-containing organic material, e.g., SOH. In the present example embodiment, the seed layer 247 may be formed by a surface treatment using hydrogen sulfide, and thus, e.g., a sulfur-containing portion serving as the seed layer 247 may be formed at a sidewall of the first mask 246.

Figure 18:
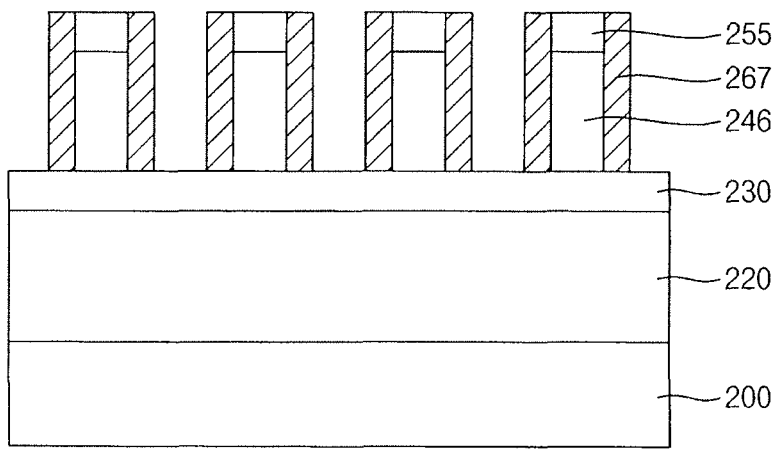

Referring to FIG. 18, a sacrificial spacer 267 may be formed on a sidewall of the stacked structure. In the present example embodiment, as illustrated with reference to FIGS. 3A and 3B or FIG. 12, a silicon precursor may be provided onto the seed layer 247 to form a silicon layer. Top and bottom portions of the silicon layer may be removed by an etch back process or an anisotropic etching process to form the sacrificial spacer 267.

Figure 19:
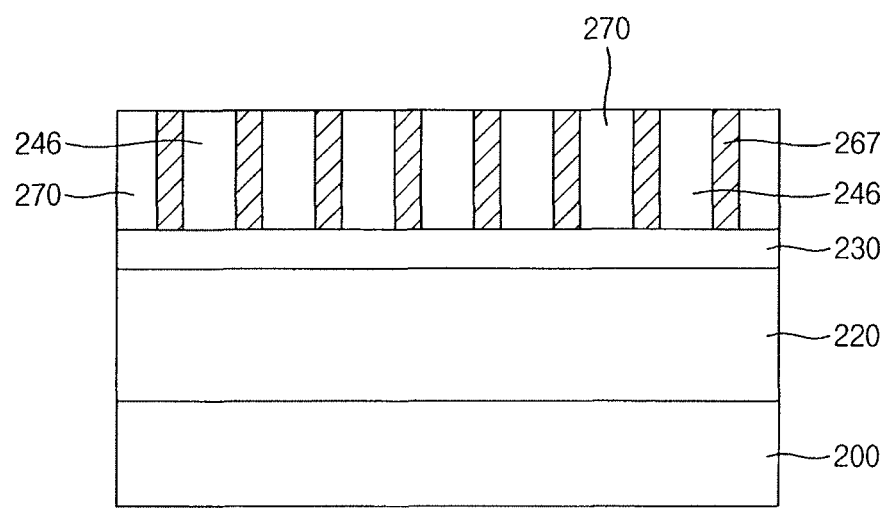

Referring to FIG. 19, a second mask 270 may be formed between neighboring ones of the sacrificial spacers 267. For example, a second mask layer may be formed on the second buffer layer 230 to cover the sacrificial spacers 267 and the stacked structures, and an upper portion of the second mask layer may be planarized by a CMP process to form the second mask 270.

In the present example embodiment, the second mask layer may include a material substantially the same as or similar to that of the first mask 246. For example, the second mask layer may include a carbon-containing material, e.g., SOH.

As shown in FIG. 19, the second buffer pattern 255 may be also removed by the CMP process. The second masks 270 and the first masks 246 may be spaced apart from each other by the sacrificial spacers 267, and may be alternately and repeatedly disposed in a horizontal direction.

Figure 20:
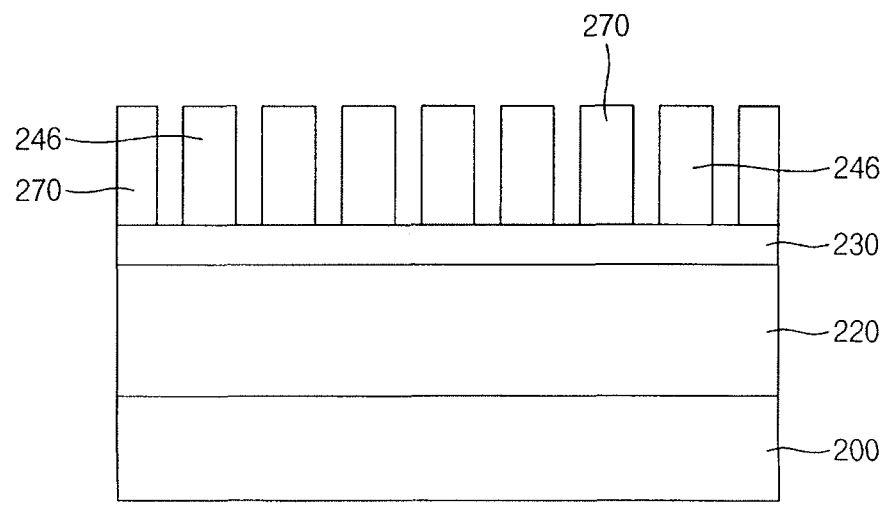

Referring to FIG. 20, the sacrificial spacers 267 may be removed. For example, the sacrificial spacers 267 may be selectively removed by a GPE process using chlorine gas. As the sacrificial spacers 267 are removed, the first and second masks 246 and 270 may be alternately and repeatedly disposed in the horizontal direction on the first buffer layer 230.

Figure 21:
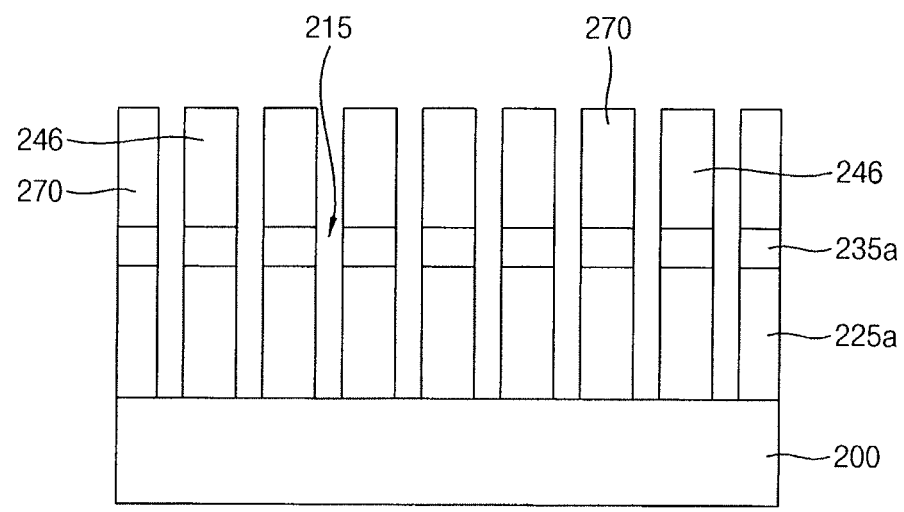

Referring to FIG. 21, the first buffer layer 230 and the etch target layer 220 may be partially removed using the first and second masks 246 and 270 as an etching mask. Thus, a first buffer pattern 235a and a target pattern 225a may be formed from the first buffer layer 230 and the etch target layer 220, respectively.

The first and second masks 246 and 270 may be removed by, e.g., an ashing process. An opening 215 may be formed in the target pattern 225a, and conductive patterns, e.g., contacts, plugs, etc., may be formed in the opening 215.

FIGS. 22 to 31 are plan views and cross-sectional views illustrating stages of a method of forming a pattern in accordance with an example embodiment. For example, FIGS. 22 to 31 show a method of forming a hole by a double patterning method, e.g., a SADP method.

Particularly, FIGS. 22, 26, 28, 30 and 31 are plan views, and FIGS. 23 to 25, 27 and 29 are cross-sectional views taken along lines I-I' of corresponding plan views, respectively. Hereinafter, two directions substantially parallel to an upper surface of a substrate and substantially perpendicular to each other may be referred to as first and second directions, respectively. Additionally, a direction substantially parallel to the upper surface of the substrate and having an acute angle with respect to the first direction or the second direction may be referred to as a third direction. This method may include processes substantially the same as or similar to those illustrated with reference to FIGS. 1 to 21, and thus detailed descriptions thereof may not be repeated.

Figure 22:
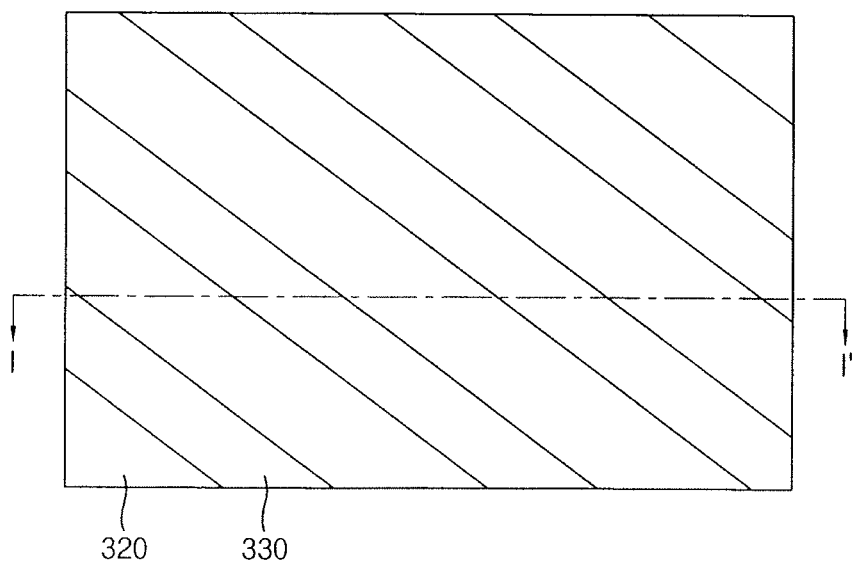
FIGS. 22 to 31 illustrate plan views and cross-sectional views of stages of a method of forming a pattern in accordance with an example embodiment.
Figure 22:
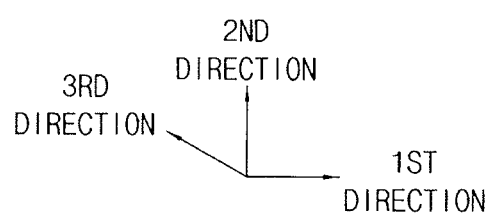
Figure 23:
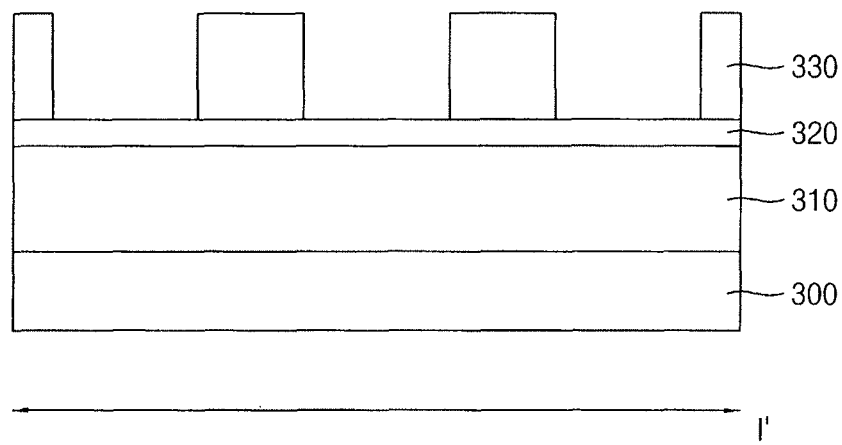

Referring to FIGS. 22 and 23, an etch target layer 310, a first buffer layer 320 and a first sacrificial pattern 330 may be sequentially formed on a substrate 300. The etch target layer 310 may be formed of an insulating material, e.g., silicon oxide or low-k organic oxide. The first buffer layer 320 may be formed of, e.g., silicon oxynitride or silicon nitride.

The first sacrificial pattern 330 may be formed by forming a first sacrificial layer including a carbon-containing material, e.g., ACL or SOH, and patterning the first sacrificial layer by a photolithography process. As shown in FIG. 22, the first sacrificial pattern 330 may extend in a diagonal direction, e.g., in the third direction. A plurality of first sacrificial patterns 330 may be formed in a direction that may be substantially parallel to the upper surface of the substrate 300 and substantially perpendicular to the third direction. An upper surface of the first buffer layer 320 between neighboring ones of the first sacrificial patterns 330 may be exposed.

Figure 24:
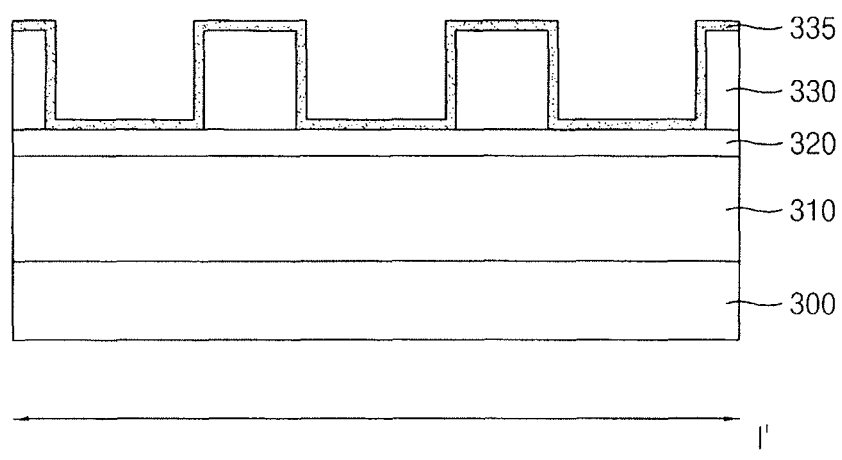

Referring to FIG. 24, processes substantially the same as or similar to those illustrated with reference to FIGS. 11A and 11B may be performed. In the present example embodiment, a sulfur-containing compound may be provided onto the first sacrificial patterns 330 to form a seed layer 335. The formation of the seed layer 335 may be enhanced by generation of, e.g., carbon-sulfide bond or carbon-silicon bond.

As shown in FIG. 24, the seed layer 335 may be conformally formed on surface of the first buffer layer 320 and the first sacrificial patterns 330. In the present example embodiment, the seed layer 335 may be formed as a sulfur-containing portion at sidewalls of the first sacrificial patterns 330, as shown in FIG. 11B.

Figure 25:
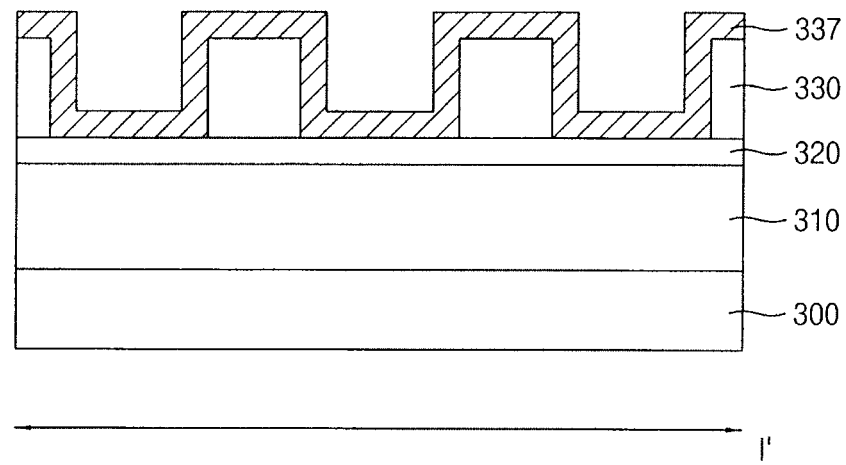

Referring to FIG. 25, processes substantially the same as or similar to those illustrated with reference to FIG. 12 may be performed. In the present example embodiment, a silicon precursor may be provided onto the seed layer 335 to form a first mask layer 337. The first mask layer may be formed of a silicon-based material, e.g., polysilicon, amorphous silicon, etc., and may be merged with the seed layer 335.

As illustrated above, the adhesion and/or affinity between the first mask layer 337 and the first sacrificial pattern 330 may be enhanced by the interaction (e.g., silicon-sulfide bond) between the sulfur atoms exposed at a surface of the seed layer 335 and the silicon precursor. Thus, the first mask layer 337 may have uniform thickness and profile, and reduced mechanical failure.

Figure 26:
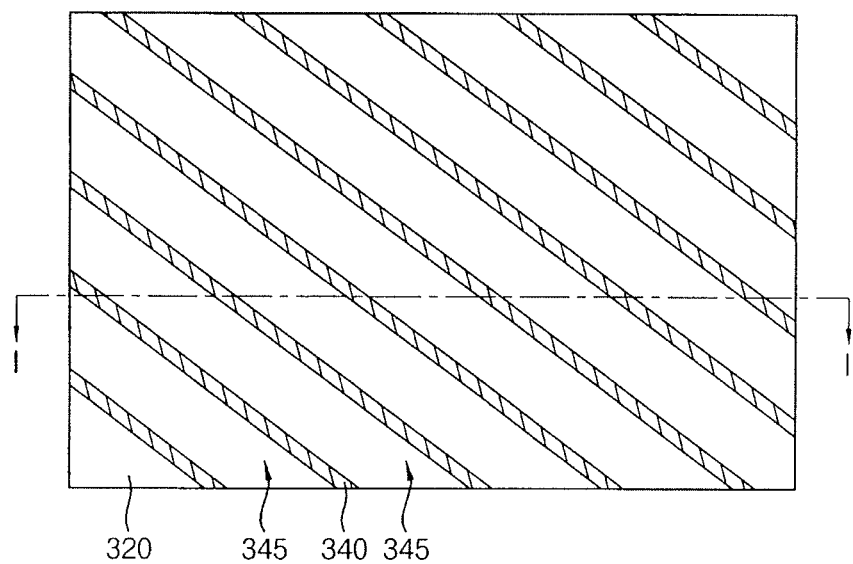
Figure 26:
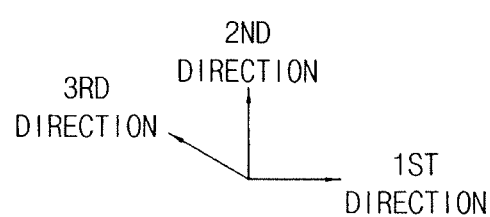
Figure 27:
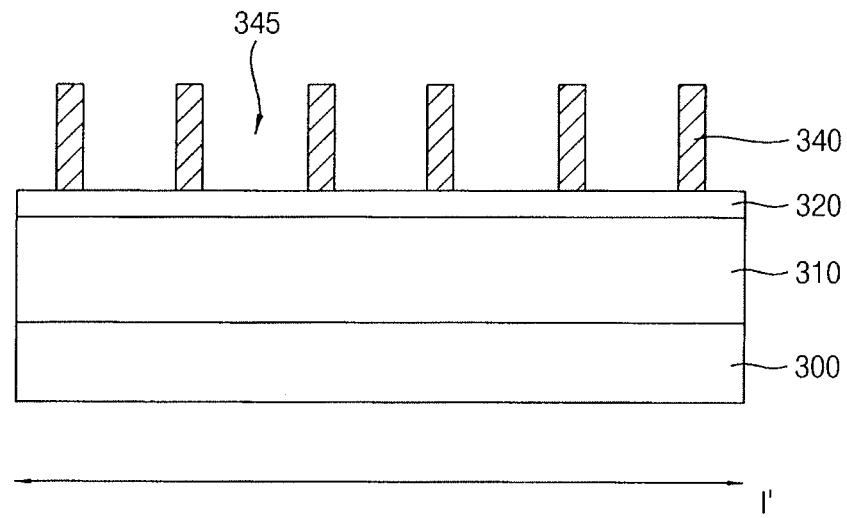

Referring to FIGS. 26 and 27, processes substantially the same as or similar to those illustrated with reference to FIGS. 13 and 14 may be performed. For example, portions of the first mask layer 337 on an upper surface of the first sacrificial pattern 330 and the first buffer layer 320 may be removed by, e.g., an etch-back process. Thus, a first mask pattern 340 may be formed on each of opposite sidewalls of the first sacrificial pattern 330. The first mask pattern 340 may be self-aligned with the sidewall of the first sacrificial pattern 330.

The first sacrificial pattern 330 may be removed by, e.g., an ashing process and/or a stripping process. In the present example embodiment, a cleaning process for removing sulfur residue generated from the seed layer 335 may be further performed.

As the first sacrificial patterns 330 are removed, first mask patterns 340 each extending in the third direction may remain on the first buffer layer 320. First openings 345 may be defined by spaces between neighboring ones of the first mask patterns 340. The first opening 345 may extend in the diagonal direction, e.g., in the third direction, and a plurality of first openings 345 may be formed in the direction substantially perpendicular to the third direction.

Figure 28:
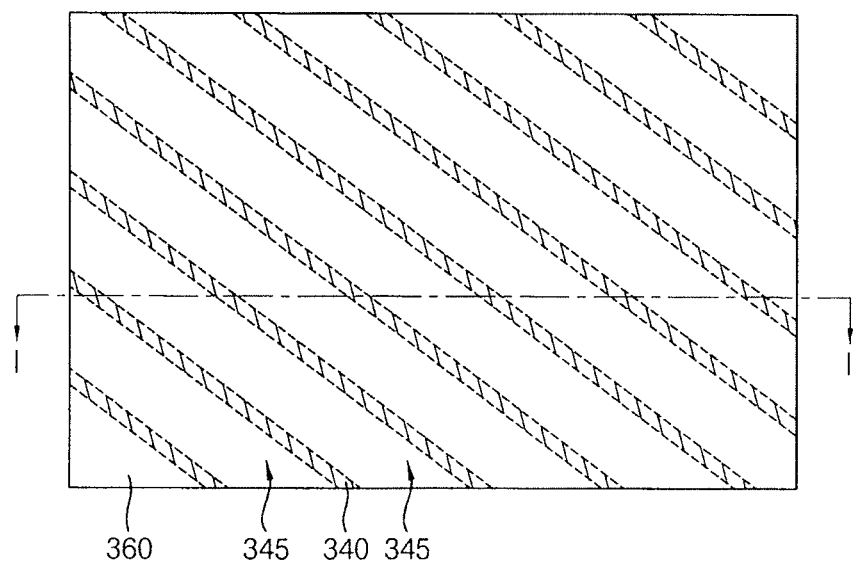
Figure 28:
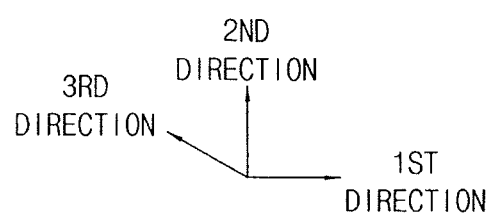
Figure 29:
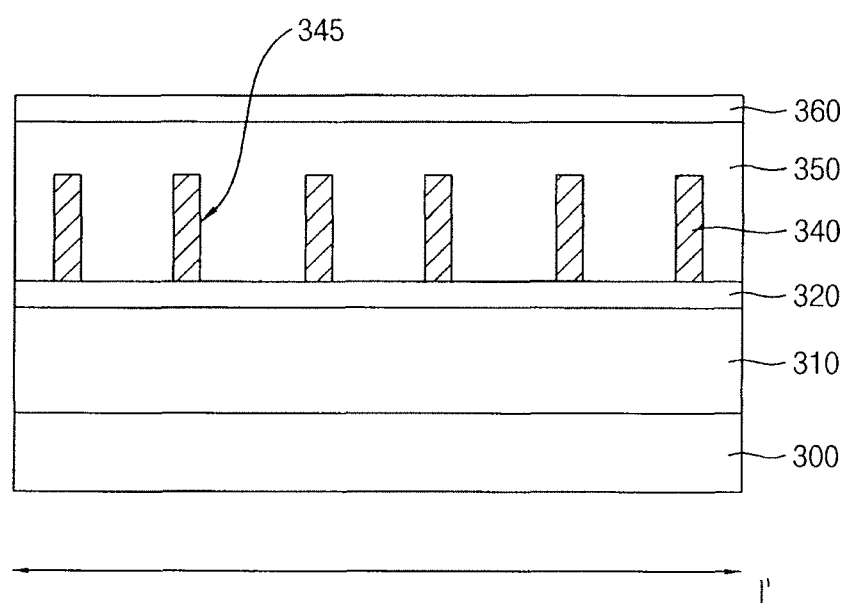

Referring to FIGS. 28 and 29, an intermediate layer 350 and a second buffer layer 360 may be sequentially formed on the first buffer layer 320 to fill the first openings 345 and cover the first mask patterns 340. The intermediate layer 350 may be formed of a carbon-containing material, e.g., ACL, SOH, etc. The second buffer layer 360 may be formed of silicon oxynitride or silicon nitride.

Processes substantially the same as or similar to those illustrated with reference to FIGS. 22 to 27 may be performed. Thus, a first double patterning process may be performed, and a second double patterning process may be performed on the intermediate layer 350 and the second buffer layer 360, which will be illustrated.

Figure 30:
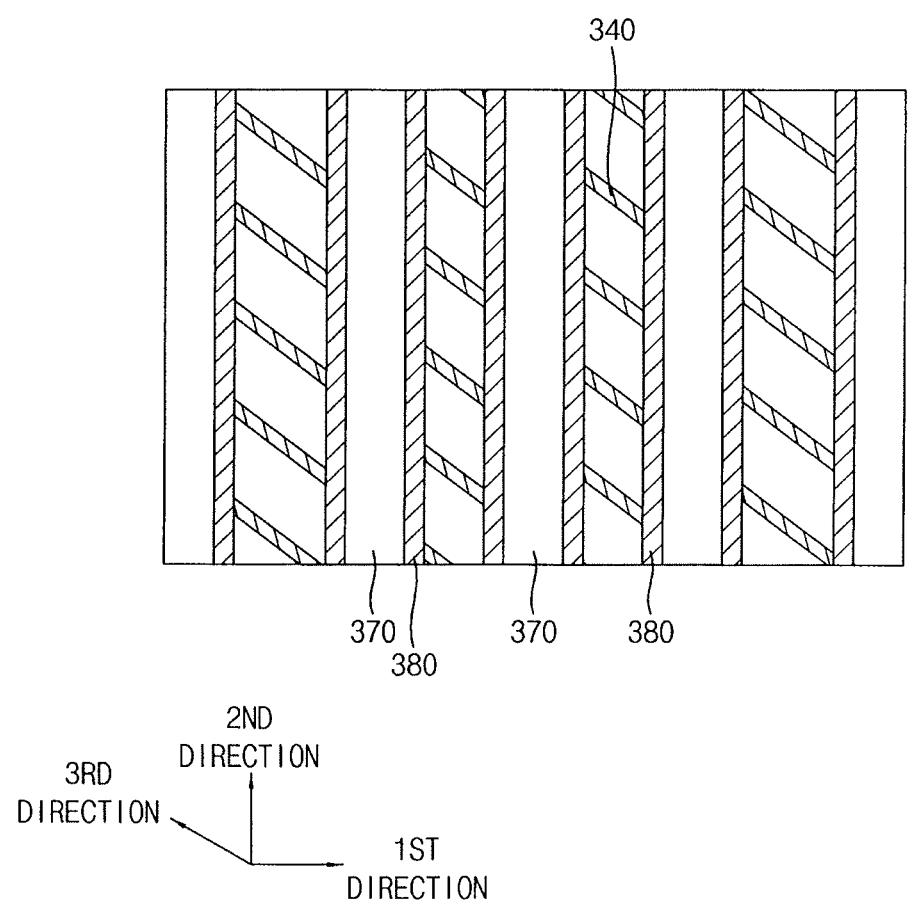

Referring to FIG. 30, a second sacrificial pattern 370 may be formed on the second buffer layer 360, and a second mask pattern 380 may be formed on a sidewall of the second sacrificial pattern 370. For the convenience of explanation, the second buffer layer 360 and the intermediate layer 350 are not shown in FIG. 23.

The second sacrificial pattern 370 may be formed of a material substantially the same as that of the first sacrificial pattern 330. In the present example embodiment, the second sacrificial pattern 370 may extend in the second direction, and a plurality of second sacrificial patterns 370 may be formed in the first direction.

Processes substantially the same as or similar to those illustrated with reference to FIGS. 11A, 11B, 12 and 13 may be performed to form a second mask pattern 380 on a sidewall of the second sacrificial pattern 370. In the present example embodiment, a seed layer may be formed on a surface of the second sacrificial pattern 370 using a sulfur-containing compound, and the formation of the second mask pattern 380 may be enhanced via the seed layer, e.g., via silicon sulfide bond. The second mask pattern 380 may be formed of a silicon-based material that may be substantially the same as that of the first mask pattern 340.

Figure 31:
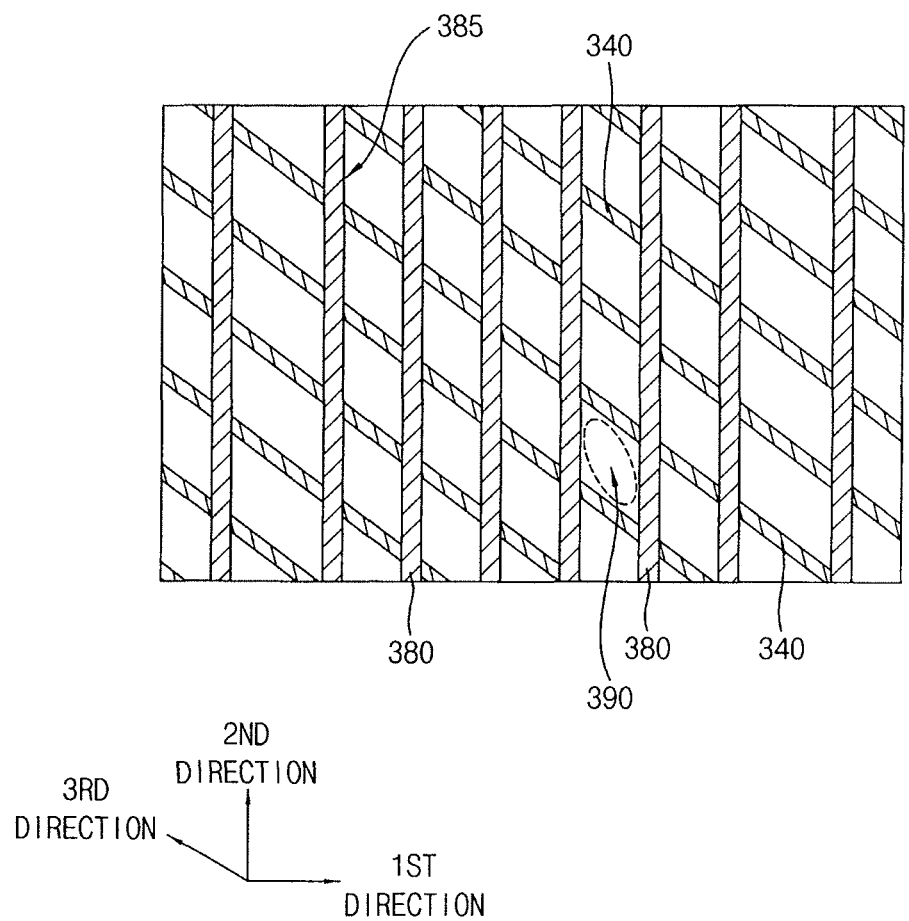

Referring to FIG. 31, the second sacrificial pattern 370 may be removed by, e.g., an ashing process. As the second sacrificial patterns 370 are removed, the second mask patterns 380 may remain, and a second opening 385 may be defined by a space between neighboring ones of the second mask patterns 380. The second opening 385 may extend in the second direction, and a plurality of second openings 385 may be formed in the first direction.

The first mask patterns 340 each extending in the third direction and the second mask patterns 380 each extending in the second direction may cross each other by the first and second double patterning processes. In the present example embodiment, a hole area 390 (indicated by a dotted line in the figure) may be defined by the first and second mask patterns 340 and 380.

Portions of the second buffer layer 360, the intermediate layer 350, the first buffer layer 320 and the etch target layer 310 in the hole area 390 may be etched to form a hole, e.g., a contact hole in the etch target layer 310.

Figure 32:
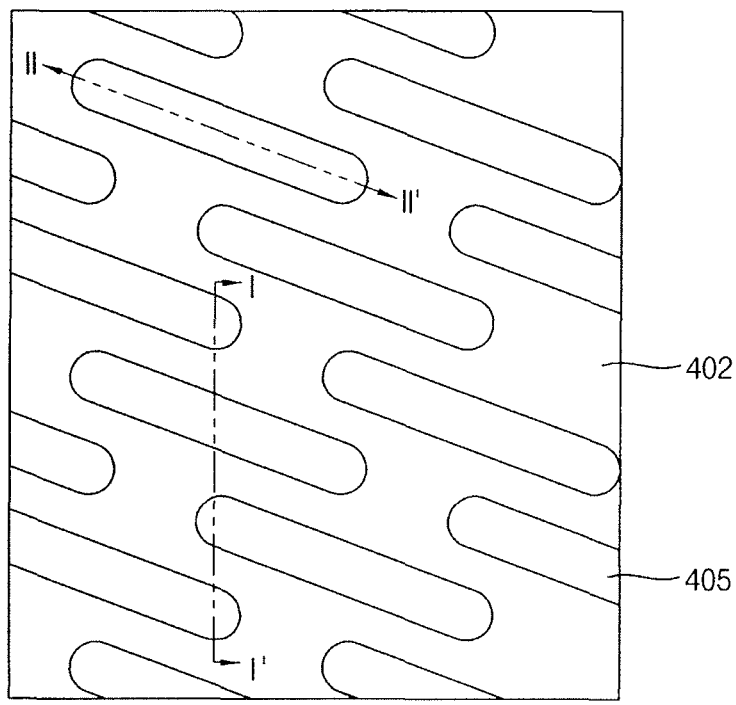
FIGS. 32 to 41 illustrate plan views and cross-sectional views of stages of a method of forming a pattern in accordance with an example embodiment.
Figure 32:
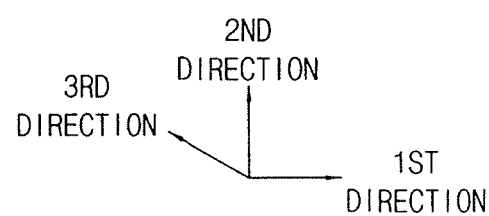
Figure 33:
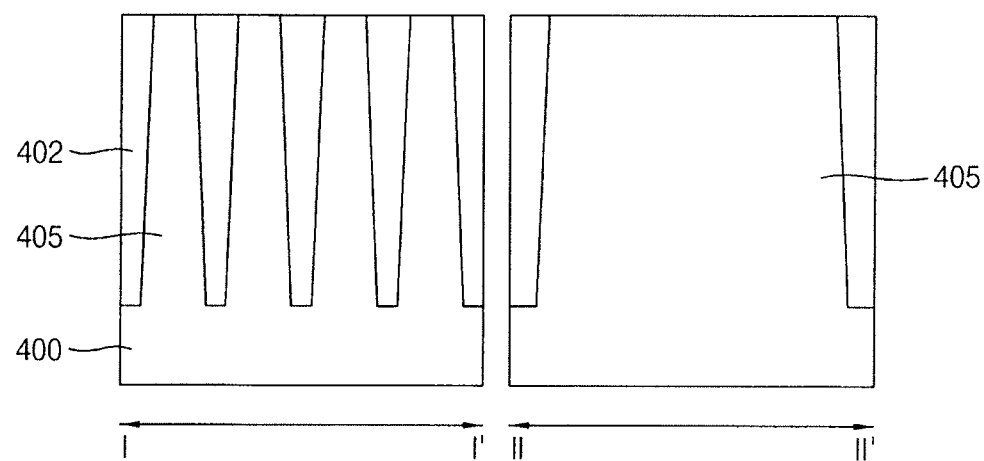
Figure 34:
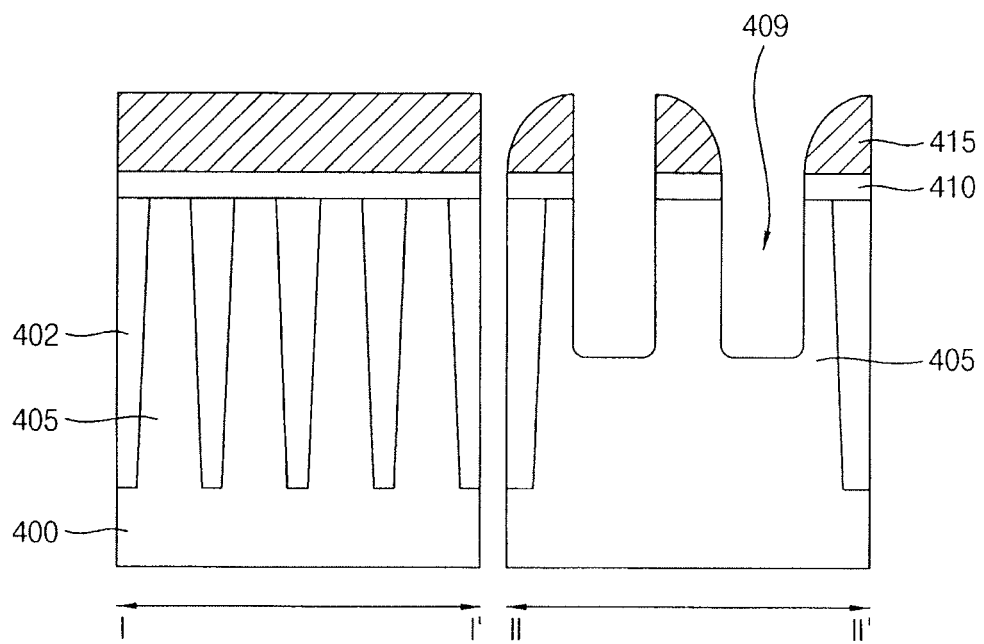
Figure 35:
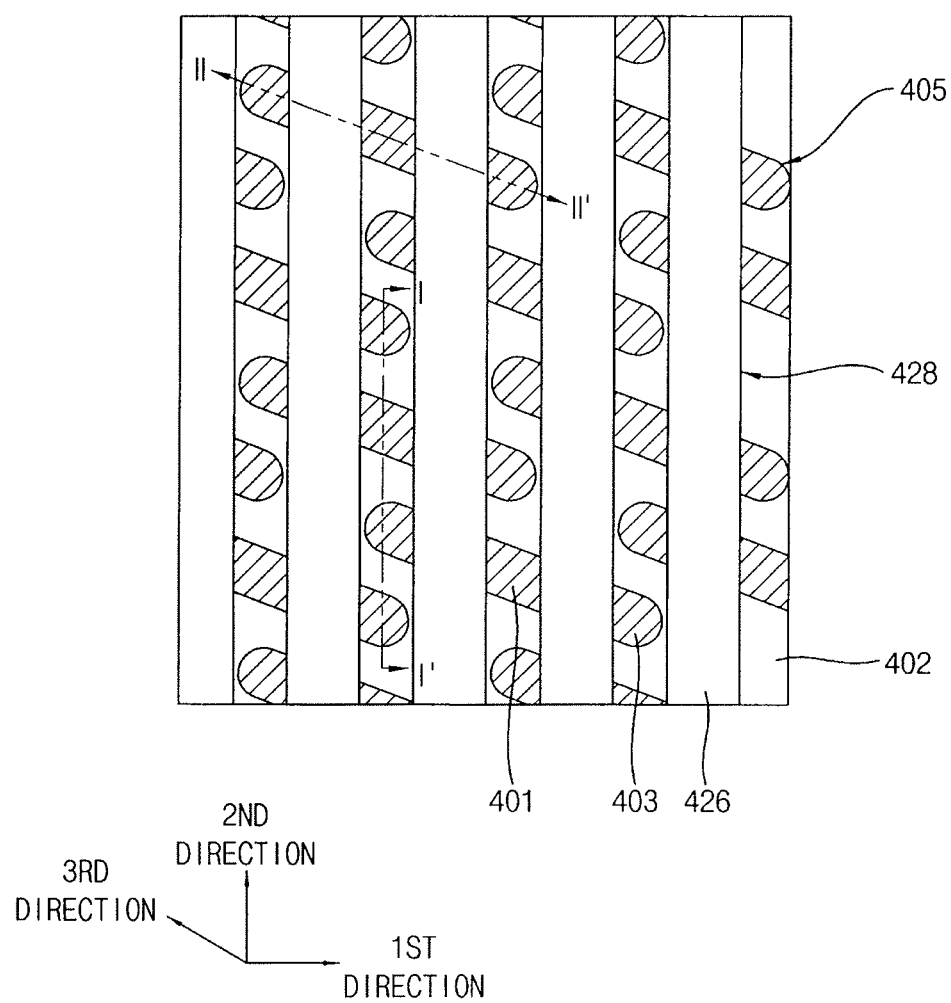
Figure 36:
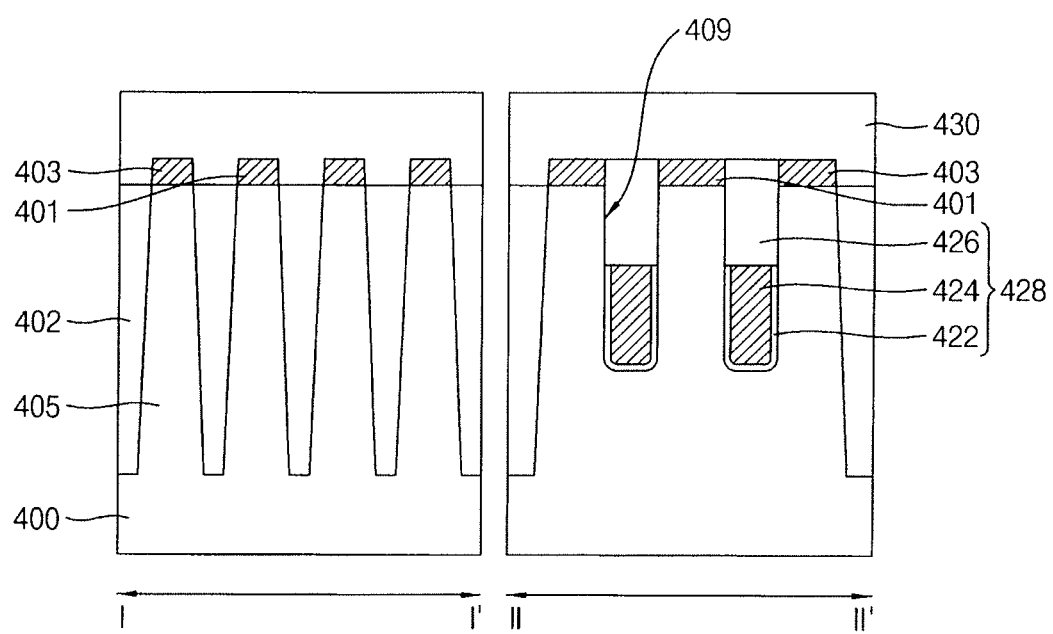
Figure 37:
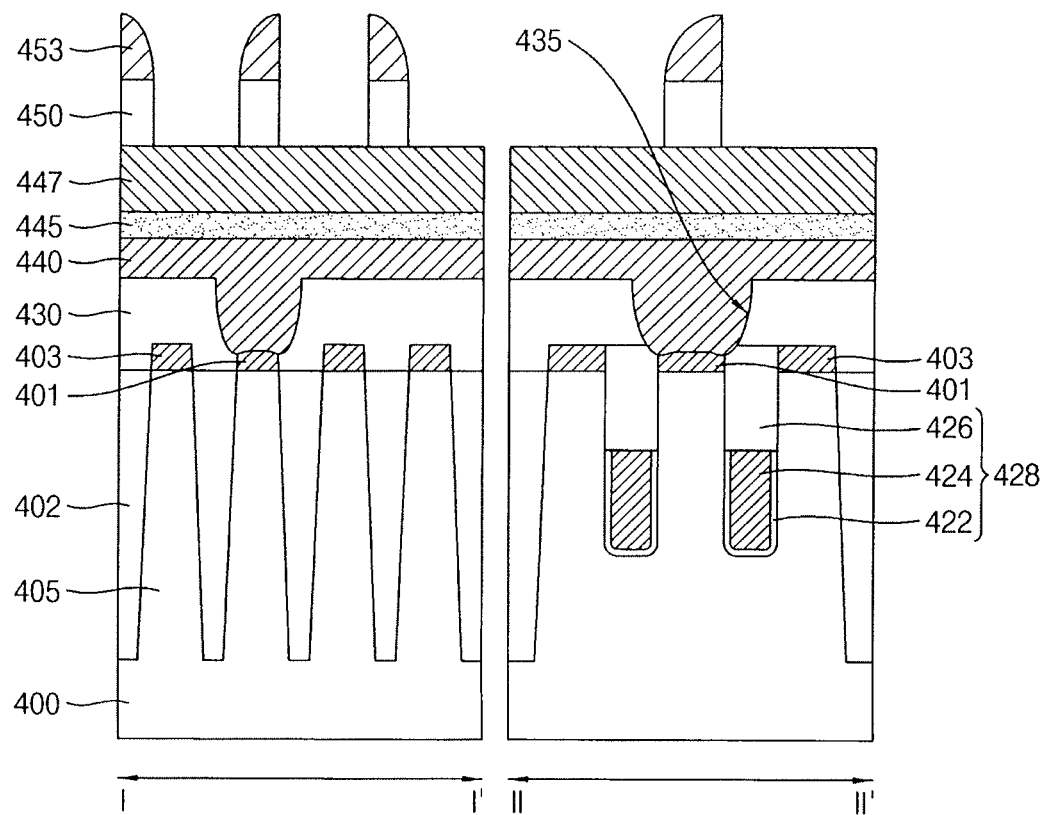
Figure 38:
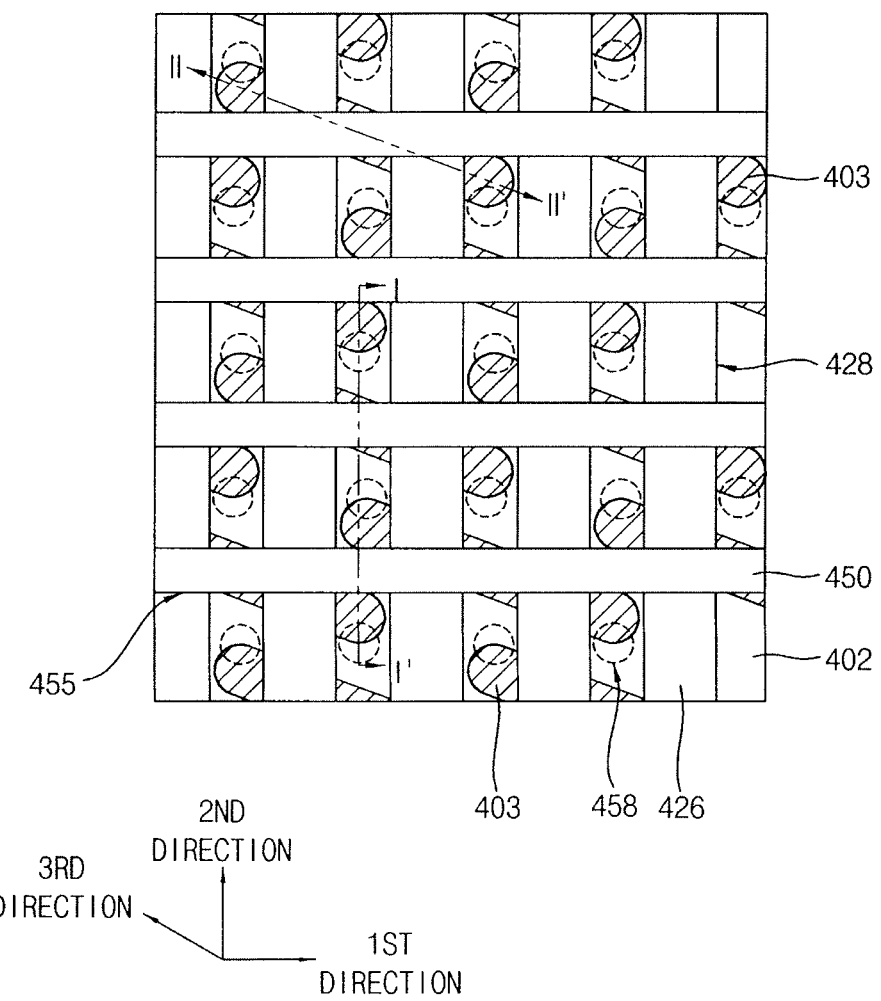

FIGS. 32 to 41 are plan views and cross-sectional views illustrating stages of a method of forming a pattern in accordance with an example embodiment. Particularly, FIGS. 32, 35 and 38 are plan views, and FIGS. 33, 34, 36, and 37-39 are cross-sectional views. Each cross-sectional view includes cross-sections taken along lines I-I' and II-II' of corresponding plan views, respectively.

For example, FIGS. 32 to 41 show a method of manufacturing a dynamic random access memory (DRAM) device having a buried cell array transistor (BCAT) structure. This method may include processes substantially the same as or similar to those illustrated with reference to FIGS. 1 to 31, and detailed descriptions thereof may not be repeated.

Referring to FIGS. 32 and 33, an isolation layer 402 may be formed on a substrate 400 to define an active pattern 405. In the present example embodiment, the isolation layer 402 and the active pattern 405 may be formed by, e.g., a shallow trench isolation (STI) process.

For example, an upper portion of the substrate 400 may be removed by an anisotropic etching process to form an isolation trench. An insulation layer may be formed of, e.g., silicon oxide on the substrate 400 to fill the isolation trench. The insulation layer may be planarized until an upper surface of the insulation layer may be exposed to form the isolation layer 402 by, e.g., a CMP process.

As the isolation layer 402 is formed, a plurality of active patterns 405 defined by the isolation layer 402 may be formed to be spaced apart from each other. As shown in FIG. 32, each active pattern 405 may extend in a diagonal direction, e.g., in the third direction. The plurality of active patterns 405 may be formed in each of the first and second directions.

In the present example embodiment, when the etching process for forming the active pattern 405 or the isolation trench is performed, the methods illustrated with reference to FIGS. 4 to 8. FIGS. 9 to 16, or FIGS. 17 to 21 may be applied. In this case, the substrate 100 may serve as an etch target layer.

Referring to FIG. 34, a buffer layer 410 may be formed on the isolation layer 402 and the active pattern 405, and a first mask pattern 415 may be formed on the buffer layer 410. The buffer layer 410, the active pattern 405, and the isolation layer 402 may be partially etched using the first mask pattern 415 as an etching mask to form a gate trench 409.

The first mask pattern 415 may be formed by processes substantially the same as or similar to those (e.g., a SADP method) illustrated with reference to FIGS. 9 to 14. In this case, the first mask pattern 415 may include a silicon-based material, e.g., polysilicon. In the present example embodiment, the first mask pattern 415 may be formed by processes substantially the same as or similar to those (e.g., a SARP method) illustrated with reference to FIGS. 17 to 20. In this case, the first mask pattern 415 may include a carbon-containing material, e.g., SOH.

The gate trench 409 may extend in the second direction, and a plurality of gate trenches 409 may be formed in the first direction. In an example embodiment, two gate trenches 409 may be formed on one active pattern 405. After forming the gate trench 409, the first mask pattern 415 may be removed by, e.g., a GPE process, an ashing process, etc.

Referring to FIGS. 35 and 36, a gate structure 428 may be formed in the gate trench 409.

For example, a thermal oxidation process may be performed on a surface of the active pattern 405 exposed by the gate trench 409 to form a gate insulation layer. In another implementation, silicon oxide or a metal oxide may be deposited on the surface of the active pattern 405 by, e.g., a CVD process to form the gate insulation layer.

A gate conductive layer may be formed on the gate insulation layer to fill a remaining portion of the gate trench 409. The gate conductive layer may be planarized until an upper surface of the buffer layer 410 may be exposed by a CMP process, and portions of the gate conductive layer and the gate insulation layer in the gate trench 409 may be partially removed. Thus, a gate insulation pattern 422 and a gate electrode 424 filling a lower portion of the gate trench 409 may be formed. The gate conductive layer may be formed by an, e.g., ALD process, a sputtering process, etc., using a metal and/or a metal nitride.

A mask layer may be formed on the gate insulation pattern 422 and the gate electrode 424 to sufficiently fill a remaining portion of the gate trench 409, and the mask layer may be planarized until the upper surface of the active pattern 405 may be exposed to form a gate mask 426. The mask layer may be formed of, e.g., silicon nitride by a CVD process. In an example embodiment, the buffer layer 410 may be removed by the planarization process.

Thus, a gate structure 428 including the gate insulation pattern 422, the gate electrode 424, and the gate mask 426 sequentially stacked in the gate trench 409 may be formed. According to the arrangement of the gate trench 409, the gate structure 428 may extend in the second direction, and a plurality of gate structures 428 may be formed in the first direction. The gate structure 428 may be buried in the active pattern 405, and an upper portion of the active pattern 405 may be divided into a central portion between two gate structures 428, and edge portions.

An ion implantation process may be performed on upper portions of the active pattern 405 adjacent the gate structure 428 to form first and second impurity regions 401 and 403, respectively. For example, the first impurity region 401 may be formed in the central portion of the active pattern 405, and the second impurity region 403 may be formed in the edge portions. The first and second impurity regions 401 and 403 may serve as source/drain regions of the semiconductor device.

In an example embodiment, as shown in FIG. 36, an upper portion of the isolation layer 402 may be removed by an etch-back process to expose an upper portion of the active pattern 405, and an ion implantation process may be performed to form the first and second impurity regions 401 and 403. The gate structure 428 and the first and second impurity regions 401 and 403 may define a BCAT structure. A first insulating interlayer 430 may be formed on the active pattern 405 and the isolation layer 402. For example, the first insulating interlayer 430 may be formed of silicon oxide, e.g., TEOS by a CVD process.

Referring to FIG. 37, the first insulating interlayer 430 may be partially etched to from a groove 435 exposing the first impurity region 401. The groove 435 may extend in the first direction, and a plurality of grooves 435 may be formed in the second direction.

A first conductive layer 440 may be formed on the first insulating interlayer 430 to fill the groove 435. A barrier conductive layer 445 and a second conductive layer 447 may be sequentially formed on the first conductive layer 440, and a conductive line mask 450 may be formed on the second conductive layer 447.

For example, the first conductive layer 440 may be formed of polysilicon, and the barrier conductive layer 445 may be formed of a metal nitride or a metal silicide nitride. The second conductive layer 447 may be formed of a metal. The first conductive layer 440, the barrier conductive layer 445 and the second conductive layer 447 may be formed by, e.g., a sputtering process, a PVD process or an ALD process.

In the present example embodiment, the first conductive layer 440 may be formed by processes substantially the same as or similar to those illustrated with reference to FIGS. 2, 3A and 3B. For example, a sulfur-containing compound may be provided onto the first insulating interlayer 430 to form a seed layer. A silicon precursor and a dopant gas may be provided onto the seed layer to form the first conductive layer 440 including doped polysilicon.

A mask layer may be formed of, e.g., silicon nitride on the second conductive layer 447, and a second mask pattern 453 may be formed on the mask layer. The mask layer may be partially etched using the second mask pattern 453 to form a conductive line mask 450.

In the present example embodiment, the second mask pattern 453 may be formed by process substantially the same as or similar to that (e.g., a SADP method) illustrated with reference to FIGS. 9 to 14. In this case, the second mask pattern 453 may include a silicon-based material, e.g., polysilicon.

In the present example embodiment, the second mask pattern 453 may be formed by process substantially the same as or similar to that (e.g., a SARP method) illustrated with reference to FIGS. 17 to 20. In this case, the second mask pattern 453 may include a carbon-containing material. e.g., SOH.

Figure 39:
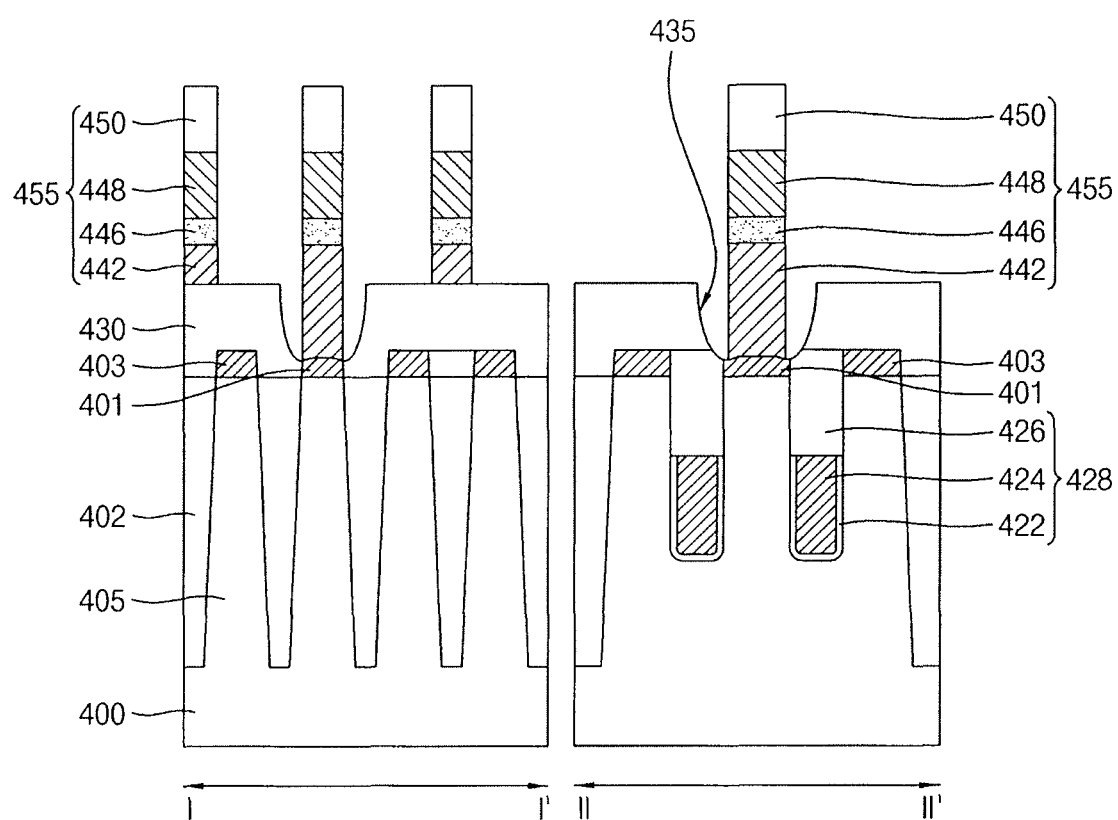

Referring to FIGS. 38 and 39, the second conductive layer 447, the barrier conductive layer 445, and the first conductive layer 440 may be sequentially etched using the second mask pattern 453 and the conductive line mask 450 as an etching mask. Thus, a first conductive pattern 442, a barrier conductive pattern 446 and a second conductive pattern 448 sequentially stacked on the first impurity region 401 may be formed. For the convenience of explanation, the first insulating interlayer 430 is not shown in FIG. 38.

Thus, a conductive line structure 455 including the first conductive pattern 442, the barrier conductive pattern 446, the second conductive pattern 448, and the mask pattern 450 sequentially stacked, and extending in the first direction on the first impurity region 401 may be formed. A plurality of conductive line structures 455 may be formed in the second direction. In the present example embodiment, the conductive line structure 455 may serve as a bit line of the semiconductor device.

In an example embodiment, the conductive line structure 455 may have a width less than that of the groove 435. Thus, a sidewall of the conductive line structure 455 may be spaced apart from a sidewall of the groove 435. After forming the conductive line structure 455, the second mask pattern 453 may be removed by, e.g., a GPE process, an ashing process, etc.

As shown in FIG. 38, a hole area 458 may be defined by the gate structures 428 and the conductive line structures 455 crossing each other, which may vertically overlap the second impurity region 403 at least partially.

Figure 40:
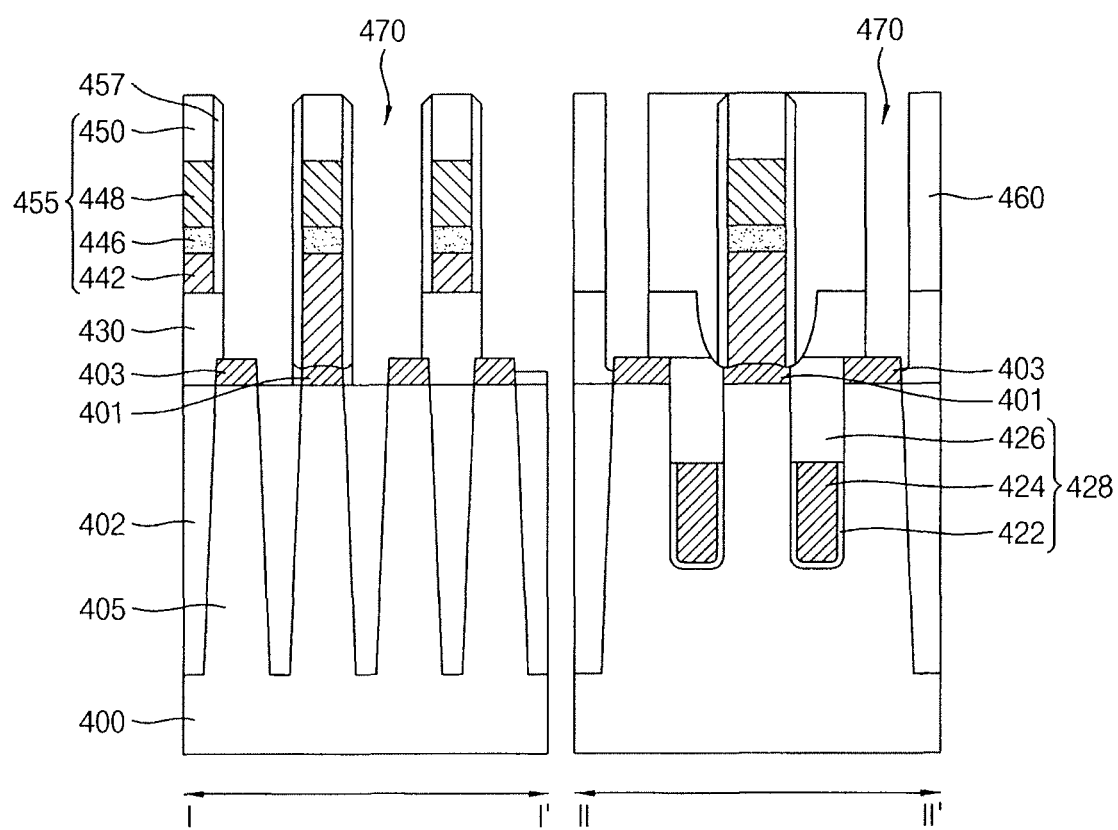

Referring to FIG. 40, a spacer 457 may be formed on the sidewall of the conductive line structure 455. For example, a spacer layer may be formed of silicon nitride on the first insulating interlayer 430 to cover the conductive line structure 455, and anisotropically etched to form the spacer 457.

A second insulating interlayer 460 may be formed on the first insulating interlayer 430 to cover the conductive line structure 455. The second insulating interlayer 460 may fill a remaining portion of the groove 435. The second insulating interlayer 460 may be formed of silicon oxide or an organic oxide, e.g., polysiloxane by a CVD process or a spin coating process. In an example embodiment, the second insulating interlayer 460 may be planarized to expose an upper surface of the conductive line mask 450.

The first and second insulating interlayers 430 and 460 may be partially removed to form contact holes 470 at least partially exposing the second impurity region 403. For example, two contact holes 470 may be formed on one active pattern 405.

In the present example embodiment, the contact holes 470 may be formed by processes substantially the same as or similar to those illustrated with reference to FIGS. 22 to 31. For example, first and second double patterning processes may be performed on the second insulating interlayer 460 to form first and second mask patterns crossing each other. The hole area 458 shown in FIG. 38 may be exposed between the first and second mask patterns.

The hole area 458 may be transferred into the first and second insulating interlayers 430 and 460 by an etching process using the first and second mask patterns. Thus, the contact hole 470 may be formed to at least partially expose the second impurity region 403. After forming the contact hole 470, the first and second mask patterns may be removed by, e.g., a GPE process.

Figure 41:
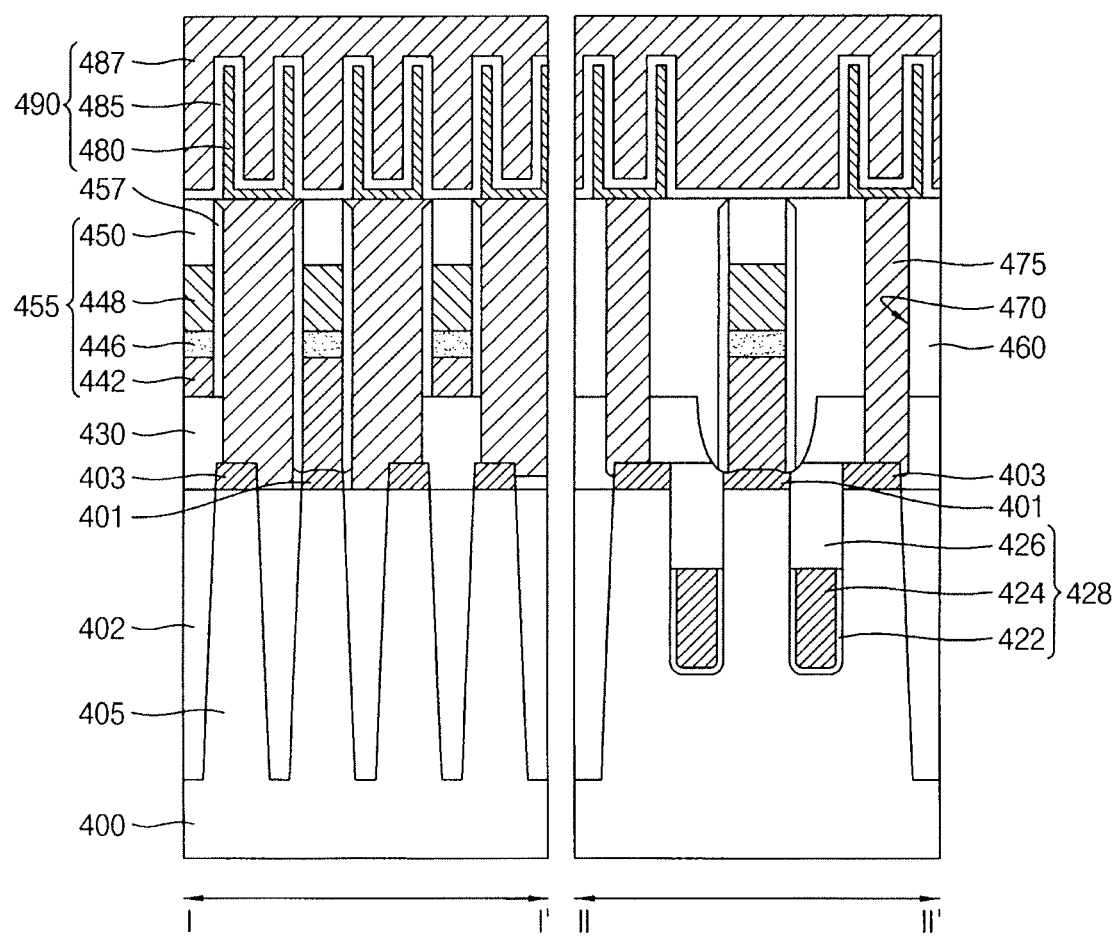

Referring to FIG. 41, a conductive contact 475 may be formed in the contact hole 470 to contact or be electrically connected to the second impurity region 403. A capacitor 490 may be formed on the conductive contact 475. In this case, the conductive contact 490 may serve as a capacitor contact.

For example, a conductive layer may be formed to fill the contact holes 470, and may be planarized until an upper surface of the conductive line mask 450 may be exposed by a CMP process. Thus, the conductive contact 475 may be formed in each of the contact holes 470 to contact the second impurity region 403. The conductive layer may be formed of a metal, e.g., copper, tungsten, etc., by a sputtering process, a PVD process, an ALD process, or a CVD process. The capacitor 490 may be formed to be electrically connected to the conductive contact 475. Thus, the DRAM device having the BCAT structure may be manufactured.

For example, an etch stop layer and a mold layer may be sequentially formed on the conductive line mask 450, the second insulating interlayer 460 and the conductive contact 475, and the mold layer and the etch stop layer may be partially removed to form a capacitor opening exposing an upper surface of the conductive contact 475.

A lower electrode 480 may be formed on an inner wall of the capacitor opening, and the mold layer may be removed. A dielectric layer 485 may be formed on the etch stop layer and the lower electrode 480, and an upper electrode 487 may be formed on the dielectric layer 485 to form the capacitor 490. The dielectric layer 485 may be formed of silicon oxide or a high-k metal oxide. The lower and upper electrodes 480 and 487 may be formed of a metal or a metal nitride, e.g., tungsten, titanium, tantalum, ruthenium, tungsten nitride, titanium nitride, tantalum nitride, etc.

As illustrated above, the method of forming the silicon layer or the pattern in accordance with an example embodiment may be applied to the formation of active patterns, gate structures, and/or conductive structures of the DRAM device. The method of forming the silicon layer or the pattern in accordance with an example embodiment may be also applied to insulation patterns, electrodes, gates, contacts, etc., or various semiconductor devices including, e.g., a DRAM device, a flash memory device, an MRAM device, a ReRAM device, a PRAM device, a logic device, etc.

The following Example and Comparative Example are provided in order to highlight characteristics of one or more embodiments, but it will be understood that the Example and Comparative Example are not to be construed as limiting the scope of the embodiments, nor is the Comparative Example to be construed as being outside the scope of the embodiments. Further, it will be understood that the embodiments are not limited to the particular details described in the Example and Comparative Example.

EXAMPLE

Bis(tert-butylthio)silane (BTBS, di(t-butylsulfanyl)silane) serving as a sulfur-containing compound was provided onto a lower layer of which an atomic ratio (atomic %) of carbon to oxygen was 85:15 in a CVD chamber to form a seed layer. A temperature of a canister storing the sulfur-containing compound was 60° C., a pressure of the CVD chamber was 150 torr, a providing time was 200 seconds, and a flow rate of nitrogen gas serving as a carrier gas was 250 sccm (400° C.). A mixture gas of monosilane and disilane serving as a silicon precursor was provided onto the seed layer at a temperature of 400° C., and borane serving as a dopant gas was provided to form a polysilicon layer. A surface roughness of the polysilicon layer was 4.64 RMS.

Comparative Example

A polysilicon layer was formed directly on a lower layer under conditions substantially the same as those of Example, except that no seed layer was formed and diisopropyl amino silane (DIPAS) was used as a silicon precursor. A surface roughness of the polysilicon layer was 7.88 RMS.

As measured in the experimental example, the polysilicon layer formed by the method in accordance with an example embodiment may have lower surface roughness via the formation of the seed layer.

By way of summation and review, a carbon-containing layer, e.g., an amorphous carbon layer (ACL) or spin-on hardmask (SOH), may have relatively poor chemical activity at a surface thereof, and thus a mask layer may not be easily formed on the carbon-containing layer, or the mask layer on the carbon-containing layer may have mechanical failure.

As described above, embodiments relate to methods of forming a silicon layer using a silicon precursor, methods of forming patterns including the silicon layer, and methods of manufacturing semiconductor devices using the same.

Example embodiments may provide a method of forming a silicon layer having improved mechanical and/or structural properties.

Example embodiments may provide a method of forming a pattern having improved mechanical and/or structural properties.

Example embodiments may provide a method of manufacturing a semiconductor device using the method of forming the pattern.

Example embodiments may provide a method in which a sulfur-containing compound may be provided onto a lower layer including, e.g., a carbon-containing material to form a seed layer. A silicon precursor may be provided onto the seed layer to form a silicon layer. Sulfur atoms exposed at a surface of the seed layer and silicon atoms included in the silicon precursor may be interacted with each other, and for example, silicon-sulfide bond may be generated. The silicon layer may have uniform thickness and profile.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a silicon layer, the method comprising:
providing a silicon-sulfur compound or a sulfur-containing gas onto a carbon-containing material layer to form a seed layer; and
providing a silicon precursor onto the seed layer to form the silicon layer.

2. The method as claimed in claim 1, wherein the silicon-sulfur compound includes a compound represented by at least one of the following Chemical Formulae 1 to 4,

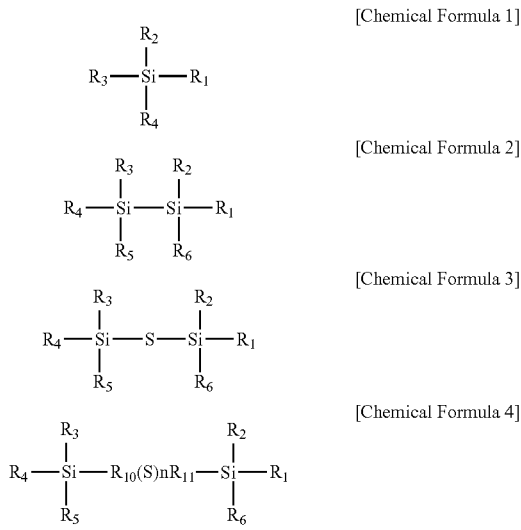

wherein in Chemical Formulae 1 to 4,
$R_1$, $R_2$, $R_3$, $R_4$, $R_5$, and $R_6$ are independently selected from $R_7$, $R_8$, —$SR_7$, —$NR_7R_8$, —$OR_7$, —$SiR_7$, and —$R_9SR_8$, in which $R_7$ and $R_8$ are independently selected from hydrogen, halogen, $C_1$-$C_{10}$ alkyl, $C_3$-$C_{10}$ alkenyl, $C_3$-$C_{10}$ alkynyl, $C_6$-$C_{10}$ aryl, $C_3$-$C_{10}$ heteroaryl, $C_3$-$C_{10}$ cycloalkyl, $C_3$-$C_{10}$ cycloalkenyl, $C_3$-$C_{10}$ cycloalkynyl, $C_3$-$C_{10}$ heterocycloalkyl, or a combination thereof, and $R_9$ is a divalent group of $C_1$-$C_{10}$ alkyl, $C_3$-$C_{10}$ alkenyl, $C_3$-$C_{10}$ alkynyl, $C_6$-$C_{10}$ aryl, $C_3$-$C_{10}$ heteroaryl, $C_3$-$C_{10}$ cycloalkyl, $C_3$-$C_{10}$ cycloalkenyl, $C_3$-$C_{10}$ cycloalkynyl, $C_3$-$C_{10}$ heterocycloalkyl, or a combination thereof, provided that,
in Chemical Formula 1, at least one of $R_1$, $R_2$, $R_3$, and $R_4$ is —$SR_7$,
in Chemical Formula 2, at least one of $R_1$, $R_2$, $R_3$, $R_4$, $R_5$, and $R_6$ is —$SR_7$, and
in Chemical Formula 4, $R_{10}$ and $R_{11}$ are independently a single bond or a divalent group of $C_1$-$C_{10}$ alkyl, $C_3$-$C_{10}$ alkenyl, $C_3$-$C_{10}$ alkynyl, $C_6$-$C_{10}$ aryl, $C_3$-$C_{10}$ heteroaryl, $C_3$-$C_{10}$ cycloalkyl, $C_3$-$C_{10}$ cycloalkenyl, $C_3$-$C_{10}$ cycloalkynyl, $C_3$-$C_{10}$ heterocycloalkyl, or a combination thereof, and n is an integer of 1 or more.

3. The method as claimed in claim 1, wherein the silicon-sulfur compound includes at least two sulfur atoms.

4. The method as claimed in claim 1, wherein the sulfur-containing gas includes hydrogen sulfide.

5. The method as claimed in claim 1, wherein forming the seed layer includes pyrolyzing the silicon-sulfur compound to form an active silicon intermediate material.

6. The method as claimed in claim 5, wherein the active silicon intermediate material includes a silicon-sulfur double bond or a silicon-sulfur cyclic structure.

7. The method as claimed in claim 1, wherein forming the silicon layer includes providing a reaction gas together with the silicon precursor, the reaction gas including at least one of oxygen and nitrogen, and wherein the silicon layer includes at least one of silicon oxide, silicon nitride, and silicon oxynitride.

8. The method as claimed in claim 1, wherein forming the silicon layer includes providing a dopant gas together with the silicon precursor, and wherein the silicon layer includes doped polysilicon.

9. The method as claimed in claim 8, wherein the dopant gas includes boron or phosphorus.

10. The method as claimed in claim 1, wherein forming the seed layer includes pyrolyzing a volatilized compound including a silicon-sulfur-silicon linkage to form a reactive silicon-sulfur species, the silicon-sulfur species being reacted with an exposed surface of the carbon-containing material layer to form a sulfur-containing surface, after which the silicon precursor is provided to the sulfur-containing surface.

* * * * *